United States Patent [19]

Meyer

[11] 4,336,505

[45] Jun. 22, 1982

[54] CONTROLLED FREQUENCY SIGNAL SOURCE APPARATUS INCLUDING A FEEDBACK PATH FOR THE REDUCTION OF PHASE NOISE

[75] Inventor: Donald G. Meyer, Sultan, Wash.

[73] Assignee: John Fluke Mfg. Co., Inc., Everett, Wash.

[21] Appl. No.: 168,065

[22] Filed: Jul. 14, 1980

[51] Int. Cl.³ .................. H03L 7/00; H03L 7/18; H03L 7/22
[52] U.S. Cl. .................. 331/1 R; 331/12; 331/16; 331/17; 331/25
[58] Field of Search .................. 331/1 A, 10–12, 331/16, 17, 23, 25, 1 R

[56] References Cited
U.S. PATENT DOCUMENTS 3,614,649  10/1971  Gerig ........................ 331/17
3,882,413  5/1975   Healey ...................... 331/12 X
4,048,580  9/1977   Campbell et al. ............ 331/1 R Primary Examiner—Siegfried H. Grimm
Attorney, Agent, or Firm—Christensen, O'Connor, Johnson & Kindness

[57] ABSTRACT

A low phase noise signal source is disclosed which incorporates a voltage controlled oscillator (VCO) and a feedback network that, in effect, demodulates the VCO output signal and supplies negative feedback representative of the VCO signal noise to the VCO frequency control terminal. The feedback network includes a frequency discriminator of the type wherein a time delay network is connected to one input port of a phase detector, with the VCO output signal being supplied to the time delay network and the second input port of the phase detector. A variable phase shifter, responsive to the signal supplied by the phase detector, is included in one of the phase detector input paths to cause a zero crossover of the frequency discriminator transfer characteristic to occur at the frequency to which the VCO is tuned. By establishing predetermined relationships between the transmission poles and zeroes of the feedback network, normal VCO tuning characteristics are preserved while simultaneously decreasing VCO phase noise. Various arrangements for operating the signal source over a wide band of output frequencies are disclosed, including a low-noise phase-locked loop frequency synthesizer.

13 Claims, 12 Drawing Figures

CONTROLLED FREQUENCY SIGNAL SOURCE APPARATUS INCLUDING A FEEDBACK PATH FOR THE REDUCTION OF PHASE NOISE

BACKGROUND OF THE INVENTION

This invention relates to signal sources for supplying a periodic electrical signal of relatively high spectral purity at a selectable signal frequency. More particularly, this invention relates to selectable frequency signal sources for supplying a signal which exhibits relatively low phase noise.

Signal sources for supplying a periodic electrical signal of relatively high spectral purity at a selectable signal frequency are required in many areas of the electrical and electronic arts. For example, such signal sources are often utilized as the signal generating stages of channelized communications equipment and often serve as test and instrumentation equipment for many purposes including the calibration, testing and maintenance of various electronic equipment.

Virtually all prior art attempts to provide selectable frequency signal sources which exhibit noise and stability characteristics compatible with the most demanding signal source design requirements are either an active oscillator that employs one or more active devices such as transistors in conjunction with tunable resonant circuits that establish positive feedback, or a circuit arrangement commonly known as a frequency synthesizer, which includes one or more active oscillators interconnected with various other circuit stages. As is known in the art, such frequency synthesizers include: (1) arrangements known as direct frequency synthesizers wherein a desired output frequency is obtained directly from the frequency of one or more applied reference signals through the operations of mixing, filtering, frequency multiplication and frequency division; (2) arrangements known as indirect frequency synthesizers wherein a voltage controlled oscillator is phase-locked to a reference signal to thereby supply an output signal at a frequency that is a rational mathematical function of the reference signal frequency; and, (3) digital synthesizer arrangements wherein the frequency of a reference signal determines an invariant sampling interval and real-time digital computation is employed to calculate a sequence of signal amplitudes which are filtered to supply an analog signal of the desired frequency. Although each type of frequency synthesizer exhibits advantages and disadvantages that can make a particular type of synthesizer preferable in a specific design situation and one or more of these synthesis techniques can be combined in a single sytem, the relatively low parts count and ability of phase-locked loop synthesizers to operate at frequencies up to several hundred megahertz with a one octave or wider bandwith has led to widespread usage of phase-locked loop arrangements.

With respect to active oscillator circuits, many types of resonant feedback structure such as inductance-capacitance networks, crystals, and distributed parameter networks (e.g., resonant cavities) are utilized in the art, with the particular resonant structure employed in each circuit design being selected on the basis of the signal frequencies to be generated as well as other desired performance characteristics. In this regard, and wih respect to relatively wideband signal sources for operation over the portion of the frequency spectrum extending between the upper portion of the VHF range and the middle portion of the UHF range (e.g., between one and several hundred megahertz), tunable resonant cavities or resonant networks employing inductors and variable capacitors of conventional construction or of the semiconductor variety (e.g., varactor diodes) are commonly employed.

It is well-known that, regardless of type of circuitry employed, no physically realizable signal source provides an output signal that is a perfect sinusoid. In particular, variations in phase or frequency and variations in amplitude are inherently associated with all signal sources because of random internal circuit noise and because of coherent noise such as that generated due to nonlinear circuit operation and bias supply ripple. Since the amplitude of the signal supplied by conventional signal sources such as active oscillator circuits and frequency synthesizer arrangements can be made relatively invariant by utilization of conventional design techniques, the primary noise component of state-of-the-art signal sources is generally phase noise.

Although the phase noise of a signal source can be specified in a number of different manners, the usual procedure is to specify the ratio between the signal power at the desired signal frequency (carrier frequency) to the power within a one hertz bandwidth that is offset from the carrier frequency by a specific amount to provide a signal-to-noise ratio (S/N) in decibels/hertz. With respect to active oscillator arrangements, the S/N is directly related to the Q of the resonant circuit and the maximum power available to the active device and is inversely related to the noise figure of the active device. Thus, it can be recognized that active oscillators utilizing high Q tunable resonant cavities can be designed to exhibit a much higher signal-to-noise ratio than active oscillators which use other types of resonant structure (e.g., L-C circuits utilizing variable inductors and/or capacitors). Accordingly, prior to this invention, active oscillators including tunable resonant cavities have generally been utilized in design applications calling for the generation of a variable frequency signal that exhibits very low phase noise.

Although signal sources employing tunable resonant cavities are capable of meeting very demanding phase noise requirements, various disadvantages and drawbacks are encountered. For example, resonant cavities that are dimensioned for operation at frequencies below the microwave range are rather large and oftentimes the signal source must generate a signal at a high frequency and utilize down conversion techniques to produce the desired signal frequency. Such a requirement not only reduces the signal-to-noise ratio that could otherwise be achieved, but increases the complexity and cost of the overall signal source. Further, and of considerable importance in many design situations, such resonant cavities must be mechanically tuned and thus must be manually adjusted each time the signal frequency is changed. Since precise and rapid control of signal frequency is often required, such resonant cavity controlled active oscillators have presented a cumbersome and time-consuming procedure. This disadvantage of the prior art resonant cavity oscillator circuit is especially important in situations in which it is desired or necessary to remotely and rapidly adjust or program the output frequency of a signal source by means of an electrical signal.

Although phase-locked loop frequency synthesizers can be electronically controlled and thus provide remote frequency programming, such circuits have not been suitable for use in situations calling for extremely low phase noise. First, as previously mentioned, phase-locked loop systems include a voltage controlled oscillator—which is itself an active oscillator network. In this regard, a conventional phase-locked loop does not provide significant improvement over performance of the VCO alone since phase perturbations at frequencies outside the phase-locked loop bandwidth are attenuated only by circuit structure that lies between the VCO output terminal and frequency control terminal. For example, a loop filter and/or a filter for suppressing the reference signal frequency are often included in conventional phase-locked loop systems and may partially suppress system noise that lies outside the loop bandwidth. However, since the frequency response of these filter networks, as well as the loop bandwidth, is determined by various design tradeoffs that must be made to achieve desired values of basic system performance characteristics such as the time required to switch the system to a new frequency, these networks cannot substantially improve phase noise performance without substantial sacrifice in system performance. Accordingly, although judicious design of phase-locked loop systems utilizing presently available components can result in noise performance as low as 100 to 120 db/hertz at an offset of 20 kilohertz, voltage controlled oscillators have not been available which permit the artisan to utilize phase-locked loop synthesizers in design situations requiring extremely low phase noise.

Accordingly, it is an object of this invention to provide a signal source which supplies an electrical signal at a selectable signal frequency wherein the signal exhibits very low phase noise.

It is another object of this invention to provide such a signal source wherein the frequency of the output signal is selected in response to an electrical signal.

It is another object of this invention to provide a low phase noise signal source capable of utilization within a phase-locked loop frequency synthesizer to thereby provide a low noise signal source system exhibiting ease of frequency selection and substantial frequency stability while simultaneously achieving low noise operation over a wide range of operating frequencies.

Still further it is an object of this invention to provide a low noise signal source suitable for use in a phase-locked loop synthesizer wherein the noise performance of the phase-locked loop is greatly improved without deleteriously affecting other performance characteristics of the phase-locked loop.

SUMMARY OF THE INVENTION

These and other objects are achieved in accordance with this invention by a signal source arrangement wherein a conventional voltage controlled oscillator (VCO) such as the type of VCO commonly utilized in phase-locked loop frequency synthesizers is augmented with a feedback network which, in effect, demodulates the signals supplied by the VCO and supplies a negative feedback signal that is proportional to the internally generated phase noise of the VCO to the VCO frequency control terminal. This negative feedback signal is summed with the conventional VCO tuning signal to provide a combined noise reduction-frequency selection signal with the feedback circuit being configured so that phase noise improvement is attained (relative to the noise level of the VCO alone) without substantially altering the VCO tuning characteristics.

In each disclosed embodiment of the invention, the frequency domain signal transfer ratio of the feedback network is established so that the relationship between the VCO output phase and the input tuning signal of the overall circuit arrangement or system includes two dominant transmission poles and two dominant transmission zeroes. More specifically, the feedback network is configured and arranged so that the system transfer function that relates output phase to the voltage applied to the VCO frequency control terminal: (1) is substantially identical to that of the VCO alone for modulation frequencies less than the frequency of the first dominant transmission pole; (2) is substantially reduced relative to the characteristics of the VCO alone for modulation frequencies between the two dominant poles of the system transfer function; and, (3) is substantially identical to that of the VCO alone for modulation frequencies above the frequency of the second dominant transmission pole. Relative to system operation and performance, this means that the DC voltage to frequency tuning characteristic of the circuit is substantially equivalent to that of the VCO alone. Further, since the transfer characteristic of a signal source configured in accordance with this invention is substantially modified from that of a conventional VCO relative to signal variations that occur within the above-mentioned midband region, the output phase noise attained in the practice of the invention is substantially reduced regardless of whether such signal variations arise from phase noise generated within the VCO or are attributable to noise components within the signal utilized to control the VCO frequency.

In each of the disclosed embodiments of the invention, the feedback network includes a discriminator circuit wherein the VCO output signal is coupled to both input ports of a phase detector with a time delay network being interconnected in one of the circuit paths to cause a phase difference of $\omega\tau$ between the phase detector input signals, where $\omega$ is $2\pi$ times the frequency of the VCO and $\tau$ is the time delay of the time delay network. The discriminator circuit also includes a variable phase shifter which is interconnected in one of the circuit paths that couple the VCO output signal to the two input ports of the phase detector to thereby cause the discriminator characteristic to be substantially equal to $K_d \cos(\omega\tau \pm \phi)$, where $K_d$ is a proportionality or gain constant associated with the phase detector, $\phi$ is the phase shift inserted by the phase shifter (in radians) and the algebraic sign is positive when the phase shifter is connected in the circuit path including the time delay network and is negative when the phase detector is installed in the circuit path not including the time delay network.

In accordance with the invention, the signal supplied by the discriminator circuit (i.e., the output of the phase detector) is coupled to a phase shifter control unit which causes the phase shifter to supply an amount of phase shift that establishes the phase detector output equal to zero at the VCO output frequency. Stated otherwise, the time delay unit and the phase detector cause the discriminator to supply a feedback signal that is directly proportional to the cosine of $\omega\tau$. The phase shifter and phase shift control unit automatically insert additional phase shift which causes a zero crossover of the cosine characteristic to correspond with the selected VCO signal frequency. In this regard, each embodiment of the invention is arranged to either operate with zero crossovers within positive-going portions of the discriminator characteristic or is arranged to operate with zero crossovers within negative-going portions thereof. In both arrangements, the signal supplied by the phase detector is coupled to the VCO frequency control terminal by an amplifier circuit which is connected for signal inversion or noninversion, depending on the relationship required to maintain the necessary negative feedback relationship.

Regardless of whether crossovers within negative-going or positive-going portions of the discriminator characteristic are utilized, the frequency range over which the phase shifter can cause a particular zero crossover of the discriminator characteristic to correspond with the signal frequency being supplied by the VCO is $\phi/(2\pi\tau)$. Since the discriminator characteristic is a cosine function exhibiting a period of $1/\tau$ (relative to the frequency of the signal supplied by the VCO), embodiments of the invention wherein the phase shifter is capable of providing $\pm\pi$ radians of phase shift are thus capable of operating over a frequency range that substantially corresponds to that of the VCO. In this regard, the presently preferred broadband embodiments of the invention include logic circuits which provide a continuous tuning capability by automatically accessing an appropriate zero crossover of the discriminator characteristic as the system frequency is initially selected or changed. Further, to avoid problems often encountered in realizing a phase shifter that accurately provides $\pm\pi$ radians of phase shift range, one disclosed embodiment utilizes a digitally-controlled phase shifter which operates in conjunction with an analog controlled phase shift network having a phase shift range of less than $\pm\pi$ radians. In another of the disclosed embodiments, the $2\pi$ radian phase shift range necessary to provide wideband operation is provided by an analog phase shifter having a phase shift capability of less than $\pm\pi$ radians and a second time delay network which selectively provides one of several values of time delay, depending on the selected VCO frequency.

In the disclosed phase-locked loop arrangement of the invention, the low noise signal source is, in effect, augmented with an additional feedback path which provides remote, digitally controlled frequency selection. Various disclosed design constraints relating to circuit parameters within the feedback path that effects phase-locked operation and circuit parameters within the noise-reducing discriminator circuit feedback path ensure overall circuit stability and provide low noise operation without substantially affecting operating characteristics associated with conventional phase-locked loop arrangements.

BRIEF DESCRIPTION OF THE DRAWINGS

Other objects and advantages of the present invention will be apparent to one of ordinary skill in the art upon consideration of the following description taken together with the accompanying drawing wherein.

DETAILED DESCRIPTION

Figure 1:
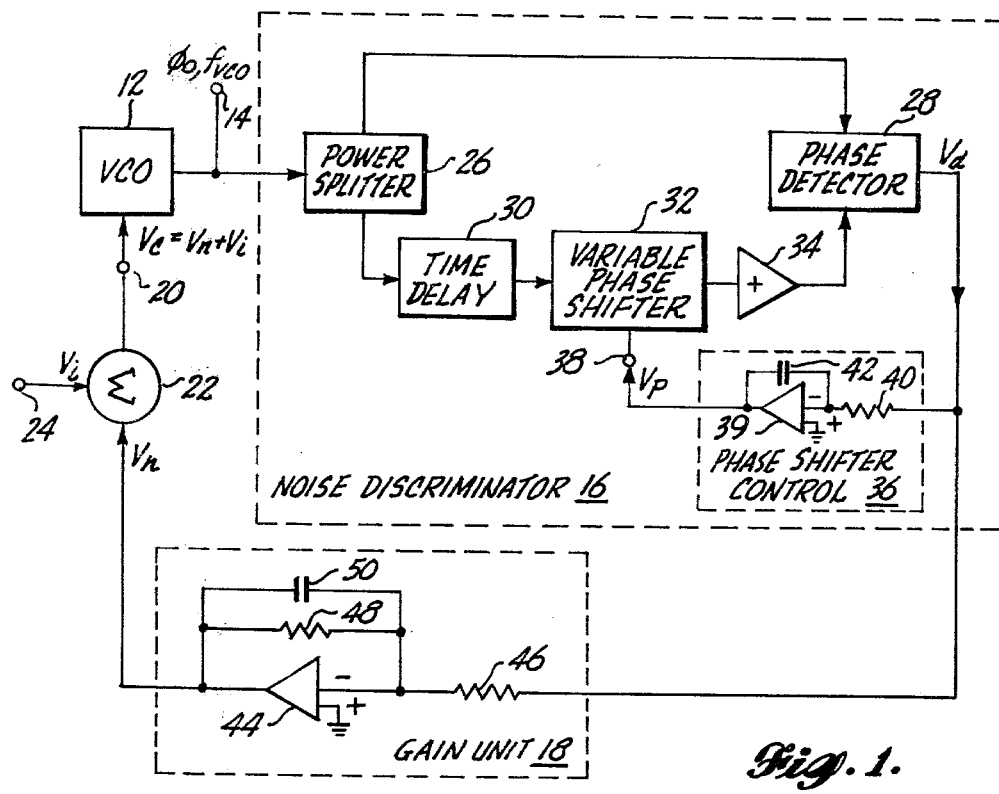
FIG. 1 is a block diagram representation which illustrates the broader aspects of the invention.

As depicted in the block diagram of FIG. 1, each embodiment of the present invention includes a voltage-controlled oscillator (VCO) 12 which is connected for supplying a periodic signal to a signal output terminal 14 and to a noise discriminator 16 that is cascade-connected with a gain unit 18 between the signal output terminal 14 and the frequency control terminal 20 of the VCO 12. More specifically, the signal supplied by gain unit 18 (denoted as $V_n$ in FIG. 1) is connected to one input port of a conventional summing unit or voltage adder 22, which has the second input port thereof connected to a terminal 24 for receiving a dc control signal $V_i$ which establishes the operating frequency of VCO 12. The output port of voltage adder 22 is connected to the frequency control terminal 20 of the VCO 12 to provide a signal $V_c$, substantially equal to $V_i+V_n$. Noise discriminator 16 and gain unit 18 are configured so that $V_n$ is a negative feedback signal that includes signal components representative of phase variations in the signal provided to system output terminal 14. In this regard, noise discriminator 16 and gain unit 18 are configured to provide substantial negative feedback over a range of offset frequencies that lies between (and is established by) two dominant circuit poles within the transfer function that defines the relationship between output phase $\phi_o$ and the control signal $V_i$. By properly positioning the transfer function poles (and the two associated zeroes), outut signal phase noise is decreased substantially below the level which would otherwise be associated with VCO 12 while simultaneously allowing normal frequency control of VCO 12 with the frequency control signal $V_i$.

In the arrangement of FIG. 1, VCO 12 can be a conventional oscillator of the type commonly used in phase-locked loop circuits to supply a signal at a frequency $f_{vco}=K_vV_c/(2\pi)$ hertz per second where $V_c$ is the signal applied to the frequency control terminal 20 and $K_v$ is the VCO conversion gain (normally expressed in radians/(volts × seconds)). It should be noted that, as utilized in the art, the term "voltage controlled oscillator" encompasses various oscillator arrangements wherein a control current establishes the signal frequency as well as circuit arrangements in which voltage is the frequency controlling parameter. Accordingly, use of the term "voltage controlled oscillator" herein should not be considered as limiting the invention to the use of any particular type of oscillator, and such term is specifically considered to include various controlled oscillator arrangements, including those that are more aptly described as being current controlled.

As can be seen in FIG. 1, noise discriminator 16 includes a power splitter or coupler 26 which receives the signal supplied by VCO 12 and supplies a portion of the VCO signal to one input port of a phase detector 28 and to the input port of a time delay unit 30. A variable phase shifter 32, connected to receive the signal supplied by time delay unit 30, supplies a signal to the second input port of phase detector 28 via a conventional amplifier 34. A phase shifter control network 36 is connected between the output port of phase detector 28 and phase shift control terminal 38 of the variable phase shifter 32.

In the practice of this invention, power splitter 26, time delay 30, amplifier 34 and phase detector 28 can be conventional circuit arrangements that are selected in view of the amplitude and frequencies of the signals to be supplied by a particular embodiment of the invention. In this regard, time delay 30 can be a length of transmission line (e.g., coaxial cable), an ultrasonic delay line such as a surface acoustic wave (SAW) delay device or any other similar delay device that meets the various criteria hereinafter set forth. Similarly, phase detector 28 can be a conventional switching type phase comparator circuit such as those commonly employed in phase-locked loop design or can be one of other well-known phase comparator arrangements which approximate an ideal multiplier circuit. As is known in the art, such multiplier type phase detector circuits supply an output signal $V_d = K_d \cos \phi_d$, where $\phi_d$ is the phase difference between the signals supplied to the phase comparator input ports and $K_d$ is a proportionality or gain constant. In terms of the depicted arrangement of noise discriminator 16, the phase detector output signal is $V_d = K_d \cos(\omega\tau + \phi_s)$, where $\tau$ is the time delay exhibited by time delay unit 30 and $\phi_s$ is the phase shift provided by variable phase shifter 32. As shall be recognized upon understanding the manner in which the invention operates to reduce phase noise, amplifier 34 can be eliminated in certain embodiments in the invention.

Continuing with the description of the basic embodiment of FIG. 1, variable phase shifter 32 is a conventional electronically-controlled phase shifter which operates in conjunction with phase shifter control 36 to supply a phase shift $\phi_s = K_s V_p$, where $K_s$ is an appropriate proportionality constant and $V_p$ is the phase shift control signal (e.g., the signal supplied to phase shift control terminal 38 in FIG. 1). More specifically, phase shifter control 36 is configured to provide a control signal, $V_p$, to terminal 38 that causes variable phase shifter 32 to supply the amount of phase that is necessary to establish the output signal provided by phase detector 38 equal to zero. This results in the center frequency of the discriminator being held precisely at the oscillator operating frequency. As shall be recognized upon understanding the hereinafter discussed embodiments, various arrangements can be utilized as variable phase shifter 32 and phase shifter control 36. For example, in the arrangement of FIG. 1, phase shifter control 36 is a conventional analog integrator circuit which includes an operational amplifier 39 having a resistor 40 connected to the inverting input terminal thereof for receiving the signal $V_d$, and a capacitor 42 that is connected between the operational amplifier output terminal and inverting input terminal. As is known in the art, when operational amplifier 39 is considered to exhibit ideal characteristics (i.e., infinite gain, bandwidth and input impedance), the analog integrator circuit of FIG. 1 exhibits a frequency domain transfer characteristic $V_p/V_d = -1/(sC_{42}R_{40})$, where s is the Laplacian operator and $C_{42}$ and $R_{40}$ respectively denote the capacitance and resistance values of capacitor 42 and resistor 40.

As mentioned above, gain unit 18 is configured so that negative feedback, $V_n$, is supplied to the VCO frequency control terminal 20 and so that the feedback function established by noise discriminator 16 and gain unit 18 (i.e., the product of the transfer characteristics of noise detector 16 and gain unit 18) causes a reduction in phase noise without deleteriously affecting the frequency tuning characteristics of VCO 12. As shall be demonstrated hereinafter, when the above mentioned analog integrator circuit is utilized as phase shifter control 36, the design constraints can be satisfied by use of a gain unit 18 which includes a conventional operational amplifier 44, a resistor 46 connected to an input terminal thereof for receiving the phase detector output signal, $V_d$, and a feedback network including shunt connected resistor 48 and capacitor 50. As is known in the art, such an amplifier arrangement exhibits a frequency domain transfer voltage characteristic $V_n/V_d = -A_0\omega_0/(s+\omega_0)$, were $A_0$ is equal to $R_{48}/R_{46}$ (the dc gain of gain unit 18), $\omega_0 = 1/R_{48}C_{50}$ and nondominant poles and zeroes which result from nonideal performance of operational amplifier 44 are omitted.

Prior to discussing operation of the arrangement of FIG. 1 relative to reduction of phase noise, the basic characteristics of noise discriminator 16 and operation of the depicted embodiment relative to frequency tuning will be considered. In this respect it can be shown that, with respect to the frequency of VCO 12 ($f_{vco}$), noise discriminator 16 supplies a signal $V_d K_d \cos(2\pi f_{vco}\tau + \phi_s)$, where $\tau$ is the time delay provided by time delay unit 30. Accordingly, if $\phi_s$ is identically equal to zero for all circuit conditions (i.e., phase shifter 32 and phase shifter control 36 eliminated from noise discriminator 16), the output voltage to input frequency transfer characteristic of noise discriminator 16 would correspond to the cosine function identified by the numeral 52 in FIG. 2 and referred to hereinafter as the "zero-phase characteristic" of noise discriminator 16. As will be noted by those skilled in the art, if phase shifter 32 and phase shifter control 36 are removed, noise detector 16 would be equivalent to a type of frequency discriminator that is commonly called a delay line discriminator and the circuit arrangement of FIG. 1 would be similar to various arrangements that are conventionally utilized to stabilize an oscillator to a desired single frequency that corresponds to a particular DC operating point on the signal transfer characteristic 52 of FIG. 2. For example, with continued reference to FIG. 2, when such conventional frequency stabilization is utilized to stabilize the VCO 12 to a signal frequency corresponding to $(4n-1)/(4\tau)$, where n is a selected positive real integer and $\tau$ is the time delay of time dealy unit 30, phase detector 28 supplies a positive output signal whenever the VCO 12 drifts to a frequency higher than the desired frequency and supplies a negative signal whenever the frequency of VCO 12 decreases. Thus, by utilizing the conventional inverting amplifier configuration of gain unit 18, the VCO frequency control terminal 20 is supplied a signal that causes the VCO to be automatically readjusted and stabilized at the desired output frequency.

Figure 2:
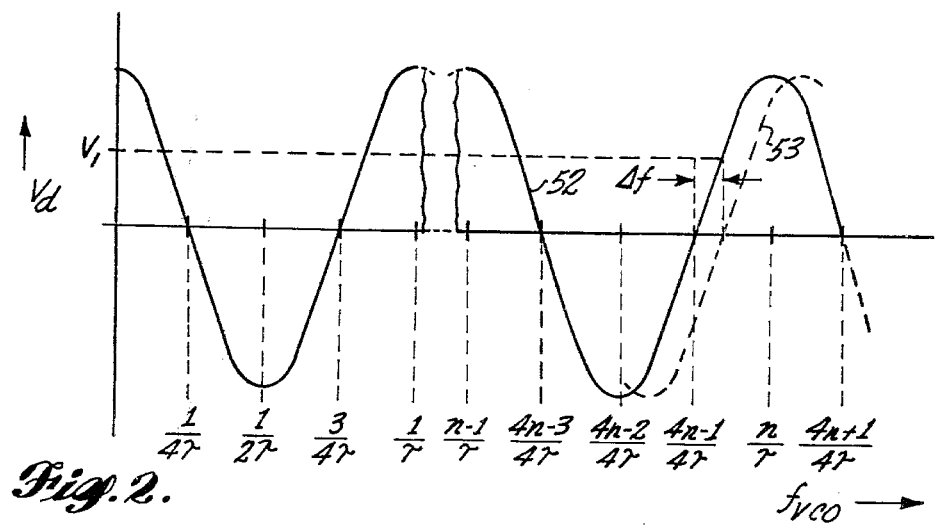
FIG. 2 illustrates electrical characteristics of the noise discriminator portion of the arrangement depicted in FIG. 1 which are useful in describing the operation of the invention.

In contrast with such prior art frequency stabilization technique, phase shifter control 36 of this invention causes variable phase shifter 32 to automatically supply phase shift which, in effect, moves the zero-phase characteristic 52 of FIG. 2 upwardly or downwardly in frequency to cause a crossover within a positive going portion of the zero phase characteristic 52 to coincide with the selected VCO frequency. Stated otherwise, in accordance with this invention phase shifter control 36 and variable phase shifter 32 operate to provide zero phase shift when the signal frequency $f_{vco}$ corresponds to a zero crossover within a positive going portion of zero phase characteristic 52 of FIG. 2 and advance or retard signal phase so that the signals supplied to the input ports of phase detector 28 remain in phase quadrature at each selected VCO frequency that does not itself correspond to such a zero crossover of zero phase characteristic 52. For example, assume that VCO 12 of the arrangement of FIG. 1 is initially tuned to a particular signal frequency $(4n-1)/(4\tau)$, where n is selected from the set of real integers, through application of an appropriate dc frequency control signal $(V_i)$ at terminal 24 and that the frequency control signal $V_i$ is then readjusted to increase the VCO frequency by a small frequency increment $\Delta f$. As illustrated in FIG. 2, such a frequency increase momentarily causes phase detector 28 to supply a positive voltage $V_d$, which, in turn, causes phase control 36 to supply a negative voltage to phase shift control terminal 38 of variable phase shifter 32. Since the phase shift supplied by variable phase shifter 32 is $K_s V_p$, this negative phase control signal causes a negative phase shift of the signal coupled to the associated input port of phase detector 28. Thus, when the VCO frequency is increased, phase shifter control 36 operates to change the phase difference between the signals supplied to the two input ports of phase detector 28. Since, as will be described in more detail hereinafter, varying the frequency of VCO 12 at fairly slow tuning rates does not provide appreciable signal flow through amplifier 18, VCO 12 will continue to operate at frequency $f_{vco}=(4n-1)/(4\tau)+\Delta f$ and phase shifter 32 will continue to subtract signal phase until the phase detector output $V_d$ is equal to zero (i.e., the signals at the input ports of phase detector 28 are in phase quadrature). Recognizing that such condition occurs only when $f_{vco}=(4n-1)/(4\tau)+\Delta f$, it can be seen that phase shifter 32 must supply $-2\pi\Delta f$ radians of phase shift and that, when such phase shift is supplied, noise discriminator 16 provides the discriminator characteristic denoted by the numeral 53 in FIG. 2. Further, it can be recognized that the embodiment of FIG. 1 operates in an analogous manner when the frequency of VCO 12 is decreased by an increment $\Delta f$ in that the phase detector 28 then momentarily supplies a negative signal $V_d$ which causes variable phase shifter 32 to insert additional phase shift until the crossover that occurs at $(4n-1)/(4\tau)$ in the zero-phase characteristic 52 corresponds to $f_{vco}=(4n-1)/(4\tau)-\Delta f$. Thus, it can be seen that the arrangement of FIG. 1 allows frequency tuning or signal selection over a range that extends $\phi_m/2\pi\tau$ hertz above and below the VCO frequency that corresponds to the selected value of $(4n-1)/(4\tau)$, where $\phi_m$ is the maximum value of negative and positive phase shift that can be supplied by phase shifter 32. Hence, if phase shifter 32 operates over the range $-\pi$ to $+\pi$ radians, an arrangement configured in accordance with FIG. 1 that is initially set to a frequency within $1/(2\tau)$ of a zero crossover at $f=(4n-1)/(4\tau)$ can be tuned to any frequency between $f_{vco}=(4n-3)/(4\tau)$ and $f_{vco}=(4n+1)/(4\tau)$ by varying the frequency control voltage $V_i$ in the conventional manner. Further, since this frequency range encompasses one complete period $(1/\tau)$ of zero-phase characteristic 52, VCO 12 can be tuned to a frequency above or below this range by first establishing the VCO frequency to correspond with a different zero crossover of zero-phase characteristic 52 and retuning the phase shift control voltage $V_p$. For example, if an arrangement of FIG. 1 is being tuned within the frequency range $(4n-3)/(4\tau)$ to $(4n+1)/(4\tau)$ and it becomes desirable or necessary to supply a signal at $(4n+1)/(4\tau)+\Delta f$, where $\Delta f \leq 1/\tau$, the arrangement of FIG. 1 can be retuned for operation between $f_{vco}=(4n+1)/(4\tau)$ and $f_{vco}=(4n+5)/(4\tau)$. As shall be described relative to the embodiments of FIGS. 4, 6 and 7, logic circuitry can be included within phase shifter control 36 to provide operation over a frequency band that exceeds $1/\tau$ without manually reinitializing the VCO frequency to another zero crossover of zero-phase characteristic 52. In effect, each of these hereinafter described embodiments can be considered as automatically selecting a zero crossover of zero-phase characteristic 52 that is within the range of phase shifter 32.

Two additional operational and structural aspects of the basic embodiment of FIG. 1 can be ascertained from FIG. 2 and the above discussion of frequency tuning or signal selection. First, the embodiment of FIG. 1 can also be configured to operate about zero crossovers that are associated with negative-going transitions of zero-phase characteristic 52 (i.e., zero crossovers at $(4n-3)/(4\tau)$, where $n=1, 2, 3, \ldots$) by configuring the system so that variable phase shifter 32 inserts negative phase shift when $V_d$ is negative and positive phase shift when $V_d$ is positive, and by utilizing a noninverting circuit arrangement that exhibits similar transfer characteristics for gain unit 18. Secondly, it can be shown that, although noise discriminator 16 of FIG. 1 utilizes time delay 30 in the same signal path as variable phase shifter 32, the invention will also operate with time delay 30 installed in series with the other input port of phase detector 28. In such an arrangement, phase shifter 32 and phase shifter control 36 must be arranged to exhibit a $V_d$ to $\phi_s$ relationship opposite to that described relative to the arrangement of FIG. 1. For example, in such an arrangement wherein the invention is configured to operate with zero crossovers that are associated with positive-going portions of zero-phase characteristic 52, phase shifter 32 and phase shifter control 36 must be configured to insert positive phase as the VCO frequency is increased and to insert negative phase shift when the VCO frequency is decreased.

Referring now to the operation of the invention to reduce phase noise, it can be recognized that the frequency domain transfer ratio $\phi_o(s)/V_i(s)$ of the arrangement of FIG. 1 can be expressed as:

$$\frac{\phi_o(s)}{V_i(s)} = \frac{T_1(s)}{1 - T_1(s) \cdot T_2(s) \cdot T_3(s)} \quad (1)$$

where $\phi_o(s)$ is the Laplace transform of time-dependent variations in the output phase of VCO 12, $T_1(s)$ represents the transfer characteristic of VCO 12, $T_2(s)$ is the transfer characteristic $V_d(s)/\phi_o(s)$ of noise discriminator 16 and $T_3(s)$ is the transfer characteristic $V_n(s)/V_d(s)$ of gain unit 18.

Neglecting nondominant transfer function singularities that can arise in practical realizations of power splitter 26 and time delay unit 30 and assuming the previously mentioned ideal transfer characteristics of phase detector 28, variable phase shifter 32 and phase shifter control 36, it can be shown that the transfer characteristic of noise discriminator 16 is approximately $V_d(s)/\phi_o(s) = s(sK_d\tau)/(s+\omega_2)$, where $\omega_2 = K_d K_s/(R_{40}C_{42})$. Further, since frequency is the time derivative of phase, the transfer characteristic $\phi_o(s)/V_c(s)$ of VCO 12 is substantially equal to $K_v/s$, and, as previously noted, the transfer characteristic of the amplifier circuit utilized as gain unit 18 in FIG. 1 is $V_n(s)/V_d(s) = -A_0\omega_0/(s+\omega_0)$, where $A_0$ is equal to $R_{48}/R_{46}$ and $\omega_0$ is equal to $1/(R_{48}C_{50})$.

Substitution of the above noted transfer characteristics of VCO 12, noise discriminator 16 and gain unit 18 into Equation 1 yields:

$$\frac{\phi_o(s)}{V_i(s)} = \frac{K_v(s + \omega_0)(s + \omega_2)}{s[s^2 + s(\omega_0 G_0 + \omega_2) + \omega_0\omega_2]} \quad (2)$$

where $G_0 = K_v K_d \tau A_0 + 1$ and represents the midband gain of the overall feedback system including noise discriminator 16, gain unit 18, and VCO 12. By suitably establishing appropriate circuit parameters of the arrangement of FIG. 1 so that $\omega_0 G_0 >> \omega_2$, this expression substantially becomes:

$$\frac{\phi_o(s)}{V_i(s)} = \frac{K_v(s + \omega_0)(s + \omega_2)}{s(s + \omega_0 G_0)(s + \omega_2/G_0)} \quad (3)$$

The improvement of the intrinsic VCO noise which is achieved by the system can now be demonstrated by the use of equation 3. In order to determine the amount that phase noise is reduced relative to the intrinsic noise of VCO 12 alone, assume that a noiseless DC tuning voltage is applied to terminal 24 of summing unit 22 and that the discriminator feedback loop is open-circuited so that the amount of noise appearing at $\phi_o$ (terminal 14) is identically equal to the internally generated VCO noise. This noise can be arbitrarily represented for purposes of calculation by a modulating noise voltage having a flat frequency spectrum and a value of $V_\phi$ volts/hertz$^{\frac{1}{2}}$ that is applied to terminal 24 of summing unit 22. Under these assumptions, the noise improvement achieved by the noise discriminator feedback path can be obtained from Equation 3, which yields:

$$\phi_o(s) = \frac{V_\phi K_v}{s} \frac{(s + \omega_0)(s + \omega_2)}{(s + \omega_0 G_0)(s + \omega_2/G_0)} \quad (3a)$$

Since it can be shown that the assumed VCO noise results in a phase noise of $\phi_o(s) = V_\phi K_v/s$, it can be recognized that the improvement in noise performance that is attained through the use of the invention when it is embodied in the manner depicted in FIG. 1 is given by the ratio of the two second order polynomials.

Figure 3:
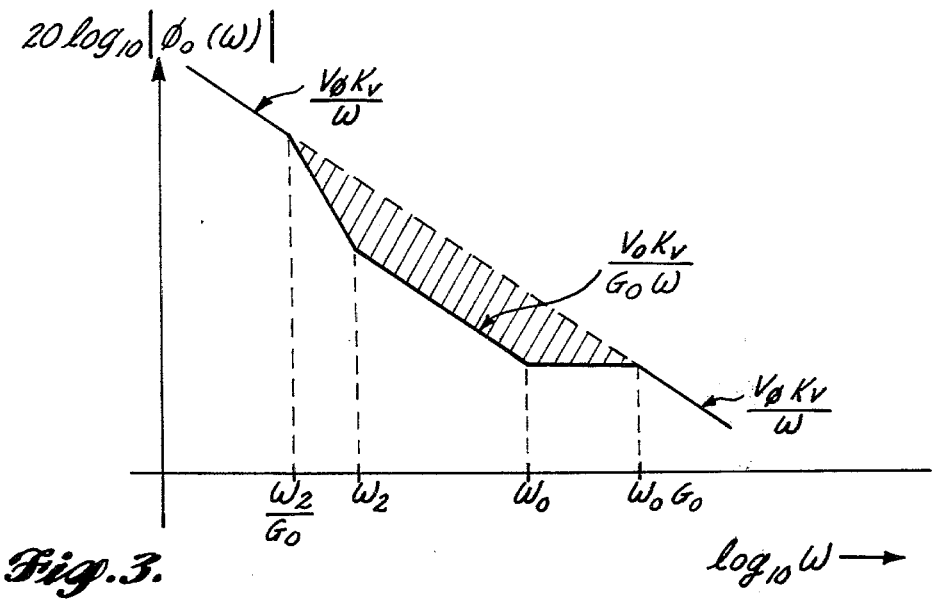
FIG. 3 graphically indicates the phase noise improvement that can be attained with the invention relative to the use of a voltage-controlled oscillator that is not configured in accordance with the invention.

The relationship of Equation (3a) and hence, the ideal noise performance is graphically illustrated by the Bode approximation of FIG. 3, wherein the real frequency variable, $\omega$, has been substituted for the Laplacian variable s. In FIG. 3, it can be seen that, in effect, the poles and zeroes of the transfer characteristic of Equation (3a) partition the output phase noise characteristic into four distinct regions. First, for signal variations below $\omega_2/G_0$, $\phi_o(\omega)$ is substantially equal to $V_\phi K_v/\omega$, which corresponds to the output phase noise response of VCO 12 alone. Thus, in the arrangement of FIG. 1, the tuning voltage $V_i$ can be varied or controlled to tune VCO 12 to a desired frequency without interference from the noise-reducing feedback action effected by noise discriminator 16 and gain unit 18 as long as the desired frequency is less than $\pm\frac{1}{2}\tau$ from a discriminator zero. As previously mentioned, embodiments of the invention which provide tuning over a bandwidth greater than $1/\tau$ without manually reinitializing the VCO 12 at a new zero crossover of the zero-phase characteristic of FIG. 2 are described herein relative to FIGS. 4, 8 and 9.

With continued reference to FIG. 3, since the overall system phase response curve lies below the unmodified or normal noise response of VCO 12 ($V_\phi K_v/\omega$) for signal variations between $\omega_2/G_0$ and $\omega_0 G_0$, it can be recognized that the arrangement of FIG. 1 provides substantially improved phase noise performance relative to that which would be provided by VCO 12 alone. In particular, between $\omega_2$ and $\omega_0$, the circuit arrangement of FIG. 1 exhibits a sensitivity to VCO phase noise and tuning voltage variations that is reduced over that exhibited by VCO 12 alone by a factor of $G_0$, which, as previously mentioned, is equal to the midband gain of the feedback loop. Further, although less than the reduction of $G_0$ that is attained within the frequency interval $\omega_2$ to $\omega_0$, reduced sensitivity to tuning voltage variations and system phase noise is exhibited within the intervals $\omega_2/G_0$ to $\omega_2$ and $\omega_0$ to $\omega_0 G_0$. Finally, for tuning voltage variations and system phase noise above $\omega_0 G_0$, the arrangement of FIG. 1 exhibits performance substantially identical to that of VCO 12 alone.

It will be recognized by those skilled in the art that the noise performance of noise discriminator 16 and gain unit 18 imposes a limit on the noise performance of this invention in that the negative feedback supplied by noise discriminator 16 and gain unit 18 cannot reduce VCO noise below the noise floor of noise discriminator 16 and gain unit 18. Thus, the maximum amount of noise reduction attainable with the invention is substantially equal to the difference between the noise performance of VCO 12 and noise performance of the discriminator feedback loop (noise discriminator 16 and gain unit 18). Since state of the art operational amplifiers and design techniques permit relatively low noise figures to be achieved in realizations of gain unit 18, this performance limit is established by noise discriminator 16. In this regard, it can be shown that the signal-to-noise ratio of noise discriminator 16 relative to a one Hertz bandwidth at an offset of $f_m$ from the frequency supplied by VCO 12 is $$\frac{S}{N}(f_m) = 10 \log_{10}\left[\frac{2P_A}{kTF}\left(\frac{f_m}{f_3}\right)^2\right] \quad (4)$$

where $P_A$ is the available power delivered by time delay unit 30, k is Boltzmann's constant, T is the temperature in degrees Kelvin, F is the noise figure of amplifier 34 and $f_3 = 1/(2\pi\tau)$, which is commonly identified as the "effective half bandwidth" of time delay unit 30.

Equation 4 not only allows estimation of the maximum attainable noise performance that can be achieved by a particular realization of the arrangement of FIG. 1, but provides a comparison of the noise performance of this invention relative to conventional active oscillators which utilize resonant structure in the feedback circuit. More specifically, those skilled in the art will recognize that Equation 4 is identical in form to the formula for the theoretical noise performance of an active oscillator where $P_A$ is the maximum available power at the input of the active oscillating device and $f_3 = f_o/(2Q_L)$, with $f_o$ being the oscillator ouput frequency and $Q_L$ being the loaded Q of the resonant feedback structure. Thus, noise performance of a signal source configured in accordance with this invention relative to noise performance of a prior art active oscillator arrangement is determined by state of the art values for the parameters $P_A$, F and $f_3$ that are associated with the two types of circuits. In this respect, the effective noise figure of the oscillating device in an active oscillator circuit is approximately 16 db for a variety of oscillator configurations including those utilizing crystals, resonant cavities, and tunable LC networks, whereas a noise figure of approximately 4 to 6 db can be achieved for the amplifier 34 of FIG. 1. Further, by utilizing a relatively large time delay, $\tau$, $f_3$ for the invention can be established substantially lower than the corresponding term in the expression for the signal-to-noise ratio of an active oscillator utilizing anything but the most precise and accurate manually-tuned resonant cavity. Thus, for example, utilizing state of the art values in Equation 4 as it applies to the noise discriminator 16 of FIG. 1 generally yields a theoretical performance limit of about 140 db/hertz at a 20 kilohertz offset ($f_m = 20$ kilohertz), whereas an electronicaly-tunable LC active oscillator of a type that provides a bandwidth of approximately one octave and utilizes a varactor-tuned tank circuit exhibits a performance limit of about 120 db/Hertz at a 20 kilohertz offset when state of the art components are utilized.

Further, since various time delay devices such as coaxial cables and surface acoustic wave devices that can be utilized as time delay unit 30 operate at relatively high power levels, it is sometimes possible to eliminate amplifier 34 of the arrangement of FIG. 1. More specifically, in situations in which optimal noise performance is not required or time delay 30 supplies sufficient signal level, amplifier 34 can be eliminated and the noise floor imposed by noise discriminator 16 is then:

$$\frac{S}{N}(f_m) = 20 \log_{10}\left[\frac{2\pi 2^{\frac{1}{2}} f_m \tau K_d}{V_{dn}}\right] \quad (5)$$

where $V_{dn}$ is the measured noise voltage at the output of phase detector 28 when a spectrally pure signal is applied to the input of noise discriminator 16.

Although Equations 4 and 5 indicate that optimal performance of the invention is obtained by selecting the largest possible value of time delay $\tau$, a constraint is imposed on the maximum value of $\tau$ by previously neglected nonideal performance of conventional delay lines and SAW delay devices. In particular, in deriving Equation 2 (the output phase to frequency control voltage transfer characteristic of FIG. 1) it was assumed that only relatively small voltage deviations occur at the output port of phase detector 28 of the noise-reducing feedback path and that the modulation rates are relatively low so that $dV_d/d\omega = K_d\tau$. In actual practice the derivative of the phase detector output signal with respect to frequency is:

$$\frac{dV_d}{d\omega} = K_d \frac{\tau \sin(\omega\tau/2)}{(\omega\tau/2)} < \omega\tau/2 \quad (5a)$$

which indicates that the actual transfer response is down by 4 dB and that $\pi/2$ radians of phase shift occurs at $\omega = \pi/\tau$, relative to the magnitude and phase components predicted by Equation 2. Thus, if $\omega_0 G_0$ is set equal to $\pi/\tau$, the noise discriminator loop is only marginally stable and could tend to oscillate. This can be remedied, however, by configuring the noise discriminator path so as to include an additional zero at or near $\omega = \pi/\tau$. For example, a resistor having a resistance value of $R = \tau/(\pi C_{50})$ can be installed in series with capacitor 50 of gain unit 18. Regardless of the manner in which the circuit zero is attained, this increases the loop gain by approximately 3 dB and reduces the phase shift by $\pi/4$ at $\omega = \pi/\tau$. Thus, Equation 2 is accurate to within $-1$ db of gain and to within $-45°$ of phase shift at $\omega = \pi/\tau$. More importantly, this means that the system is unconditionally stable when $\omega_0 G_0$ is set equal to $\pi/\tau$, having a phase margin of approximately $\pi/4$.

With respect to the above discussion it should be noted that maximum improvement in VCO phase noise is attained when $\omega_0 G_0$ approximately equals $\pi/\tau$. Accordingly, the presently preferred embodiments of the invention include a corresponding zero in the transfer function of the discriminator path, regardless of the value $\tau$ employed. Further, when such a circuit zero is attained by a resistor connected in series with capacitor 50, in the manner noted above, it has been found that increasing the resistance value somewhat from the value of $\tau/(\pi C_{50})$, improves noise performance in the vicinity of $\omega = \pi/\tau$.

Figure 4:
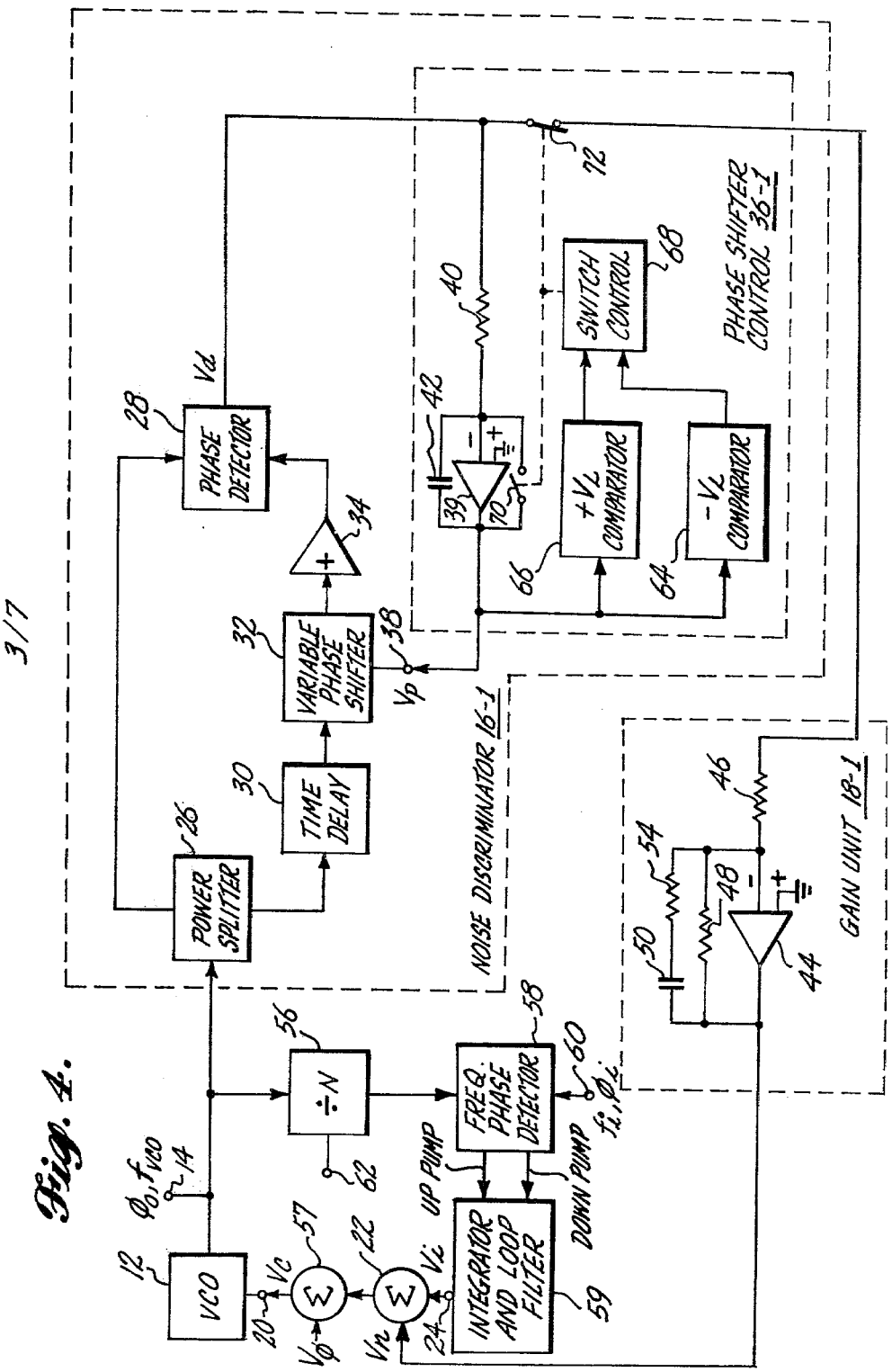
FIG. 4 depicts a more detailed, broadband embodiment of the invention which is configured as a phase-locked loop system.

Reference will now be made to FIG. 4, which illustrates an embodiment of the invention that includes: (1) the above-mentioned zero in the transfer characteristic of the gain unit 18-1 which couples the noise-reducing signal to the VCO; (2) arrangement of the invention for phase-locked loop operation; and (3) augmentation of a phase shifter control 36-1 which permits operation over an output range exceeding $1/\tau$ without requiring manually reinitializing the VCO frequency to coincide with another zero crossover within a positive-going portion of the zero phase characteristic of noise discriminator 16-1. More specifically, and with reference to the additional circuit zero, gain unit 18-1 of the arrangement of FIG. 4 includes a resistor 54 that is connected in series with the capacitor 50. As stated above, as long as $R_{54}$ is substantially equal to $\tau/\pi C_{50}$, optimum noise performance is attained and system stability is maintained.

With continued reference to FIG. 4, embodiment of the present invention as a phase-locked loop circuit basically entails utilizing a signal source of this invention as the voltage controlled oscillator within one of the various conventional phase-locked loop circuits and suitably establishing various circuit parameters to ensure system stability. In this respect, FIG. 4 depicts the invention embodied as a programmable divide-by-N phase-locked loop frequency synthesizer wherein a programmable frequency divider 56, frequency/phase detector 58 and integrator and loop filter 59 provide the frequency control or tuning signal ($V_i$) to VCO 12. More specifically, as is illustrated in FIG. 4, the two input ports of frequency/phase detector 58 are respectively connected for receiving the signal supplied by programmable frequency divider 56 and a reference signal ($f_i$, $\phi_i$) that is coupled to frequency/phase detector 58 via a terminal 60.

Programmable frequency divider 56 is connected for receiving the signal supplied by VCO 12 and divides the frequency of the signal by N, where N is established by a control signal. Typically, programmable frequency divider 56 is a conventional digital counter circuit which supplies a single output pulse for each N input pulses where N is the decimal value of a parallel format digital control signal that is applied to counter control terminals (symbolically represented by terminal 62 in FIG. 4).

Figure 10:
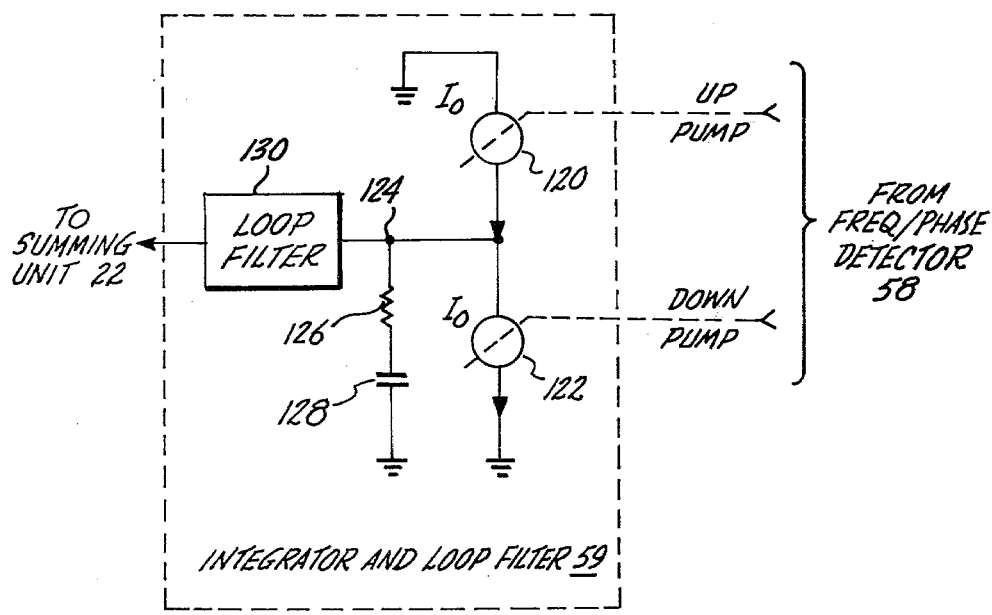

Frequency/phase detector 58 is a conventional circuit arrangement (such as the MC 12040, manufactured by Motorola, Inc.) which provides two digital output signals commonly called the up pump and down pump outputs. Although other arrangements are possible, this type of detector circuit can be employed with the type of integrator and loop filter 59 that is depicted in FIG. 10 to achieve VCO lockup without presteering whenever the VCO frequency is changed by supplying a different value of N to the frequency control terminal 62. In particular, if a VCO frequency is selected that exceeds the previous system frequency, the feedback signal $f_o/N$ is greater than $f_i$ and frequency/phase detector 58 supplies pulses at the up pump output terminal. These pulses cause a controlled current source 120 within integrator and loop filter 59 (FIG. 10) to supply corresponding pulse currents of $I_o$ amps, which, in turn, causes an average current of $I_o/2$ amps to flow into a circuit node 124. Since circuit node 124 is coupled to input port 24 of summing unit 22 via a loop filter 130 and is coupled to circuit common through series-connected resistor 126 and capacitor 128, it can be recognized that the constant current, $I_o/2$, causes the potential at node 124 and hence frequency control terminal 20 of VCO 12 to increase at a constant rate. This action continues until VCO 12 reaches the proper frequency (i.e., phase-lock), at which time $f_o/N$ becomes identically equal to $f_i$ and frequency/phase detector 58 ceases supplying the signal pulses that activate controlled current source 120.

Operation of frequency/phase detector 58 and integrator and loop filter 59 is similar when the system VCO is retuned to a lower frequency in that $f_o/N < f_i$ causes frequency/phase detector 58 to supply signal pulses at the down pump output terminal, which activate a controlled current source 122 of the integrator and loop filter of FIG. 10. Controlled current source 122 supplies corresponding pulse currents of $I_o$ amps and will cause an average current of $I_o/2$ to flow out of circuit node 124 whenever down pump signal pulses are present. Thus, the voltage at circuit node 124 decreases at a constant rate, causing VCO 12 to decrease in frequency until phase-lock ($f_o/N = f_i$) is attained.

Resistor 126 of integrator and loop filter 59 establishes the gain characteristic of frequency/phase detector 58, which can be shown to be $I_o R_{126}/(2\pi)$ volts/radian. Although series-connected resistor 126 and capacitor 128 cause a zero in the transfer function of frequency/phase detector 58 at approximately $\omega = 1/(R_{126} C_{128})$, there is no substantial affect on circuit performance and the mathematical relationships set forth herein, as long as the zero is established at a relatively low frequency (i.e., at a frequency less than the previously defined $\omega_2$).

Loop filter 130 of integrator and loop filter 59 is configured to reduce signal components at frequency $f_i$ which may be coupled through frequency/phase detector 58. As is known in the art, various low-pass filter structures can be employed, including both active and passive circuit arrangements.

In view of the above discussion of the arrangement of FIG. 4 it can be noted that such an embodiment of the invention effectively comprises two circuit loops, one of which corresponds to a conventional phase-locked loop circuit and one of which corresponds to the previously described basic embodiment of the invention, with VCO 12 being common to both loops. Thus, the phase-locked loop of FIG. 4 is essentially a signal source configured in accordance with the previously described primary aspects of the invention and embedded within a phase-locked loop. As shall be demonstrated in the following paragraphs, proper control over circuit values (i.e., positioning of the transmission pole-zero pairs) provides a phase-locked system wherein tuning and frequency-lock are achieved in substantially a conventional manner while phase noise is simultaneously reduced below the level exhibited by conventional phase-locked arrangements. For clarity in describing the relationship between the embodiment of FIG. 4 and the corresponding prior art, that portion of the circuit of FIG. 4 which effects phase-locked loop operation (i.e., programmable frequency divider 56, frequency/phase detector 58 and integrator and loop filter 59 will be hereinafter referred to as the frequency control path and the feedback path including noise discriminator 16-1 and gain unit 18-1 will be referred to as the noise reduction path.

As was the case with the arrangement of the invention depicted in FIG. 1, both the stability and noise exhibited by the phase-locked loop arrangement of FIG. 4 can be understood with reference to the system transfer function, which can be shown to be $$\frac{\phi_o(s)}{\phi_i(s)} = \frac{K_\phi K_v(s+\omega_0)(s+\omega_2)}{s^3 + s^2(\omega_0 G_0 + \omega_2 + \omega_3) + s(\omega_0 \omega_2 + \omega_0 \omega_3 + \omega_2 \omega_3) + \omega_0 \omega_2 \omega_3} \quad (6)$$

where $K_\phi$ is the conversion gain of frequency/phase detector 58, $\omega_3 = K_v K_\phi/N$ is the crossover frequency of the phase-locked loop formed by VCO 12 and the frequency control path (i.e., the crossover frequency that would be exhibited with the noise path open-circuited) and the remaining terms are defined by the relationships described relative to Equation 2. Further, it can be shown that as long as $\omega_2$ is less than 0.2 $\omega_3/G_0$, the denominator of Equation 6 is substantially equivalent to (and can be replaced by):

$$(s+\omega_3/G_0)(s+\omega_0 G_0)(s+\omega_2)$$

substituting this expression into Equation 6, the zero at $\omega_2$ is effectively cancelled by the pole at or very near $\omega_2$ and the overall system transfer function becomes:

$$\frac{\phi_o(s)}{\phi_i(s)} = \frac{K_\phi K_v(s + \omega_0)}{(s + \omega_3/G_0)(s + \omega_0 G_0)} \quad (7)$$

Figure 5:
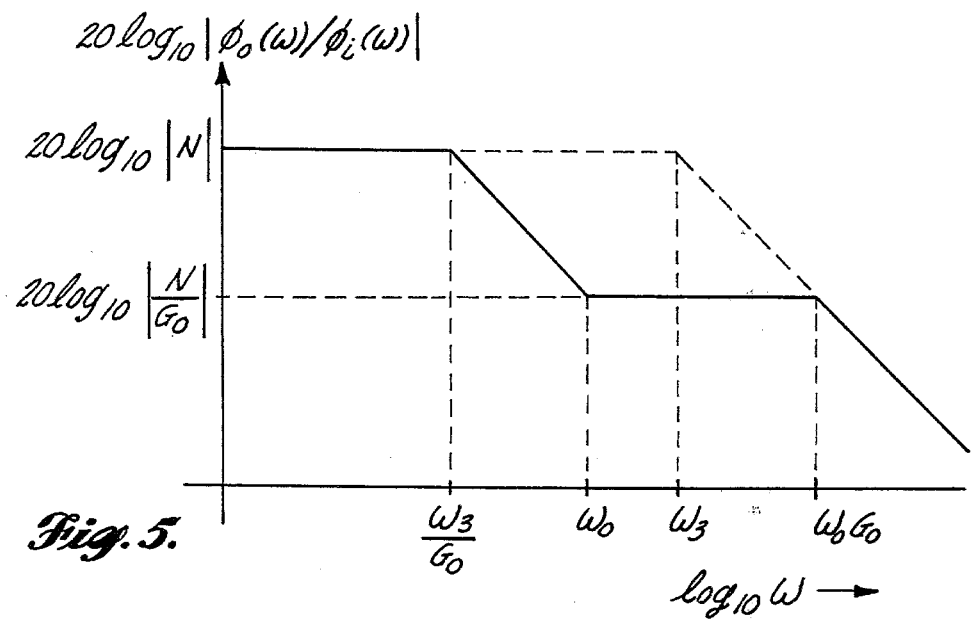
FIG. 5 graphically illustrates the input to output transfer function $\phi_o(\omega)/\phi_i(\omega)$ of the embodiment of FIG. 4, demonstrating stable operation under all necessary operating conditions.

Both the stability and phase-lock characteristics of the embodiment depicted in FIG. 4 can be recognized with reference to FIG. 5, which depicts the Bode approximation for the amplitude response of the transfer function that is defined by Equation 7 where s has been replaced by $\omega$. As is shown in FIG. 5, the amplitude response: (1) is substantially equal to N (where N is the division ratio of programmable frequency divider 56), for all frequencies below $\omega_3/G_0$; decreases at 20 db/decade within the frequency range $\omega_3/G_0$ to $\omega_0$; is substantially constant between $\omega_0$ and $\omega_0 G_0$; and decreases at 20 db/decade for frequencies greater than $\omega_0 G_0$.

As is indicated in FIG. 5 by the dashed-line segments, the phase-locked loop formed by VCO 12 and the frequency control path (i.e., operation of the embodiment of FIG. 4 when the noise reduction path is open-circuited) exhibits an amplitude response that is equal to N for all frequencies less than $\omega_3$, and decreases at 20 db/decade for frequencies greater than $\omega_3$. Thus, it can be recognized that the arrangement of FIG. 4 exhibits input-output transfer characteristics identical to that of a conventional phase-locked loop relative to offset frequencies less than $\omega_3/G_0$. Stated otherwise, $\omega_3/G_0$ can be considered as defining the bandwidth of the phase-locked loop embodiment depicted in FIG. 4 and, when $\omega_2 < \omega_3/G_0 < \omega_0$, the circuit arrangement remains stable and exhibits tuning characteristics identical to those of a conventionally arranged phase-locked loop having an identical crossover frequency. Accordingly, in the practice of this invention, attainment of a particular loop bandwidth requires a larger value of $K_\phi$ than would be required in a conventional phase-locked loop arrangement. However, phase detectors exhibiting sufficient conversion gain $K_\phi$ are readily available for use as phase detector 58 and this constraint presents little or no impediment to utilizing the invention. In fact, since the signal-to-noise ratio inside the bandwidth of the phase-locked loop is directly proportional to $K_\phi$, when the circuit of FIG. 4 is embodied to exhibit a particular loop bandwidth, phase noise within that bandwidth due to noise generated internal to the phase detector will be lower than that of a conventional phase-locked loop having an identical crossover frequency as long as the noise level of the phase detector employed is relatively invariant with respect to changes in $K_\phi$.

As previously indicated, it is necessary to establish $\omega_2$ substantially less than $\omega_3/G_0$ (e.g., five times smaller) in order to provide a pole at approximately $\omega_2$ and obtain the input-output phase relationship of Equation 7. Further, to provide a high degree of design flexibility and allow optimal noise performance relative to the various phase-lock loop arrangements and VCO's that can be utilized in the practice of the invention, the circuit values of the presently preferred embodiments of FIG. 4 are established such that $\omega_2 < \omega_3/G_0 < \omega_0$. However, it has been determined that the system remains stable even if the circuit values employed are such that the zero at $\omega_2$ is somewhat higher in frequency than $\omega_3/G_0$, with the only noticeable affect being a slight increase or "peaking" of the amplitude response $\phi_o(\omega)/\phi_i(\omega)$ at or near $\omega_3/G_0$.

As shall be described in more detail, phase shift controller 36-1 of the embodiment of FIG. 4 opens the noise reduction loop under certain frequency tuning conditions in order to cause an appropriate zero crossover of the zero-phase characteristic associated with noise discriminator 16-1 to correspond with the desired VCO output frequency. During such switching operations $\phi_o(\omega)/\phi_i(\omega)$ becomes equal to N for frequencies less than $\omega_3$, i.e., the loop bandwidth increases to $\omega_3$ and it can be shown that the system is unconditionally stable as long as the filter within the frequency selection path (e.g., loop filter 130 of the arrangement in FIG. 10) does not exhibit phase shift greater than $\pi/2$ at frequencies up to approximately $\omega_3$. There are, of course, situations where it is desirable or necessary to utilize a loop filter having a transfer function pole (or poles) only slightly above $\omega_3/G_0$, and in these cases, additional circuitry may be required. One arrangement for suitably altering the transfer characteristics of the phase locked loop during frequency acquisition is disclosed in copending patent application Ser. No. 168,524 of Kingsley W. Craft entitled "Frequency Modulated Phase-Locked Loop Signal Source", filed of even date with this application and assigned to the assignee of this invention.

The phase noise reduction characteristics of the embodiment of FIG. 4 can be understood by assuming that a flat noise source of magnitude $V_\phi$ volts/hertz$^{\frac{1}{2}}$ is injected into a summing unit 57, connected between VCO frequency control terminal 20 and the output port of summing unit 22, to thereby model VCO 12 as a noiseless VCO modulated with a flat noise source of magnitude $V_\phi$ volt/-$h_z^{\frac{1}{2}}$ (as was done in the derivation of equation 3A). Based on the associated system transfer function, $\phi_o(s)/V_\phi$, it can be seen that, under these conditions the system produces a noise spectrum given by the expression:

$$\phi_o(s) = \frac{V_\phi K_v(s + \omega_0)}{(s + \omega_3/G_0)(s + \omega_0 G_0)} \quad (8)$$

Figure 6:
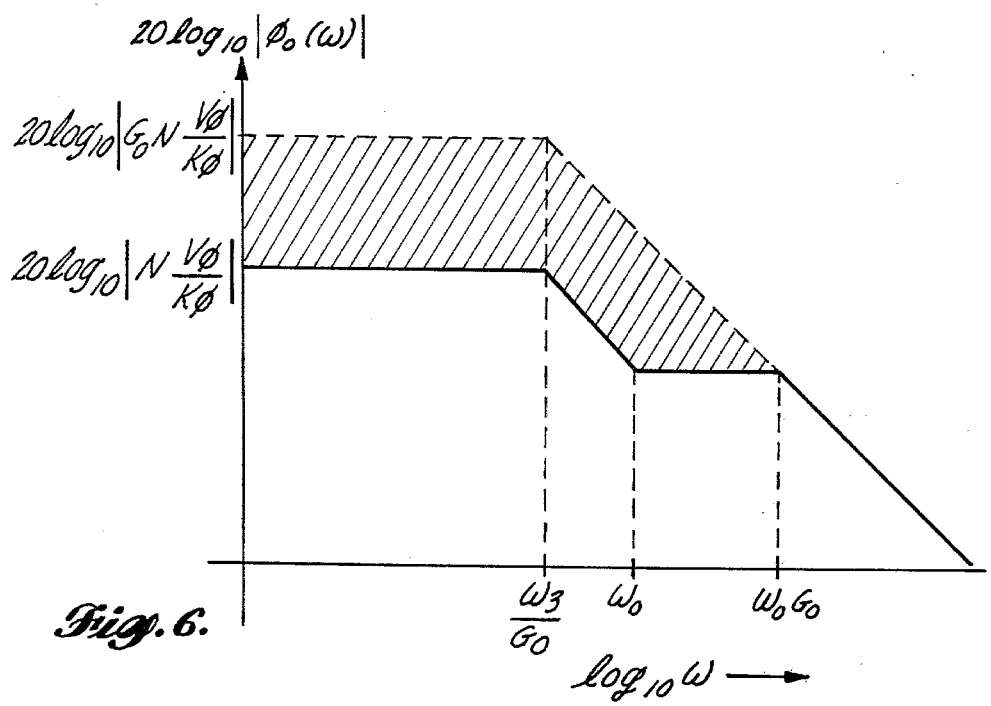
FIG. 6 graphically depicts the reduced phase noise characteristics of the embodiment of FIG. 4, relative to an equivalent conventionally arranged phase-locked loop system.

Referring now to FIG. 6, which graphically depicts the Bode approximation to this transfer function wherein the variable s has been transformed to the frequency variable $\omega$, it can be seen that a noise level of $V_\phi$ volts/hertz$^{\frac{1}{2}}$ results in output phase noise in the signal provided by the system of FIG. 4 that is defined by $|\phi_o(\omega)| = NV_\phi/K_\phi$ for frequencies within the system bandwidth, $\omega_3/G_0$. Since, as previously mentioned, a conventionally arranged phase-locked loop of the type employed in the embodiment of FIG. 4 (i.e., a circuit without the noise reduction path) would utilize a phase detector gain factor equal to $K_\phi/G_0$ to achieve a bandwidth of $\omega_3/G_0$, the phase noise of such a system exceeds the noise of the arrangement of FIG. 4 by a factor equal to $G_0$. That is, as is illustrated by the dashed lines of FIG. 6, eliminating the noise reduction path of the arrangement of FIG. 4 and reducing the phase detector gain so as to maintain the same loop bandwidth would cause phase noise to increase by a factor of $G_0$ as long as the internal noise signal of phase detector 58 is relatively invariant with respect to changes in $K_\phi$.

As is further illustrated in FIG. 6, the phase noise response of the embodiment depicted in FIG. 4 decreases at 20 db/decade for frequencies between $\omega_3/G_0$ and $\omega_0$; remains substantially constant for frequencies between $\omega_0$ and $\omega_0 G_0$; and, decreases at 20 db/decade for frequencies that exceed $\omega_0 G_0$. Comparing this response to that of a conventional phase-locked loop (one which does not include the noise reduction loop of this invention), it can be seen that phase noise is improved by a factor of $G_0$ for offset frequencies $\omega$ in the range of $0 < \omega < \omega_0$. Within the frequency range between $\omega_0$ and $\omega_0 G_0$, the improvement in phase noise decreases as a function of offset frequency; being equal to the noise performance of the corresponding conventionally configured phase-locked loop for all frequencies equal to and exceeding $\omega_0 G_0$.

It will be recalled that, as described relative to FIG. 2, the phase shifter control network 36 of the basic embodiment of FIG. 1 operates to maintain a crossover of the noise discriminator output characteristic aligned with the VCO frequency so that the range of output signal frequencies that can be obtained with each particular zero crossover of the discriminator zero-phase characteristic extends $\phi_m/(2\pi\tau)$ above and below the frequency of that particular zero crossover, where $\phi_m$ is the maximum positive and negative value of phase shift that can be supplied by variable phase shifter 32. Thus, if $\phi_m$ is 180° ($\pi$ radians) and the circuit is arranged to operate with zero crossovers associated with positive-going portions of the zero-phase characteristic (i.e., crossovers of the zero-phase characteristic which occur at the frequencies $(4n-1)/(4\tau)$, where $n=1, 2, 3, \ldots$) VCO 12 cannot be tuned above a frequency corresponding to $(4n+1)/(4\tau)$ or below a frequency corresponding to $(4n-3)/(4\tau)$ without reinitializing the system for operation with a different zero crossover which lies within $1/(2\tau)$ of the desired frequency. In this regard and as previously mentioned, various logic circuits can be employed within noise discriminator 16 to, in effect, provide automatic acquisition of a zero-phase characteristic crossover that is within $1/(2\tau)$ of a desired output frequency to thereby allow simplified tuning of VCO 12 over a frequency range that exceeds $1/\tau$.

Turning now to the specific logic circuit provisions of the phase-locked loop embodiment of FIG. 4 which enable the depicted embodiment to provide an output signal over an extended frequency range, it can be noted that the phase shifter control network 36-1 of FIG. 4 differs from the phase shift control network 36 of the embodiment of FIG. 1 in that phase shifter control network 36-1 includes a comparator 64 and a comparator 66 that are commonly connected for receiving the signal supplied by amplifier 39 and a switching unit 68 that is responsive to the signals supplied by comparators 64 and 66 for operating switches 70 and 72 which respectively interconnect the input and output terminals of amplifier 39 and interrupt signal flow to gain unit 18-1. In this arrangement, comparators 64 and 66 are conventional comparator circuits which respectively change output state when the variable phase shifter control signal $V_p$ is less than that which causes $-\pi$ radians of phase shift and greater than that which causes $+\pi$ radians of phase shift and switching unit 68 can be any conventional switching arrangement which functions in the described manner. For example, in one embodiment of the invention, switches 70 and 72 are field-effect transistor switches arranged to enter conductive states opposite to those indicated in FIG. 4 when a positive signal level is applied to the gate electrodes thereof and switching unit 68 is a conventional one-shot multivibrator which supplies a positive pulse of predetermined time duration each time comparator 64 or comparator 66 supplies an output signal indicating that phase shifter 32 is being stressed beyond the phase shift limits of $-\pi$ or $+\pi$.

Regardless of the exact arrangement of switching unit 68 and switches 70 and 72, operation of phase shift control network 36-1 of FIG. 4 can be understood with reference to FIG. 7 which depicts signals appropriate to an embodiment of FIG. 4 which is configured to operate with crossovers within positive-going portions of the noise detector zero-phase characteristic 52' and wherein the phase shift provided by variable phase shifter 32 is linearly related to the phase shift control signal $V_p$, i.e., $\phi_s = K_s V_p = (\pi/V_L)V_p$ over the phase shift range $-\pi \leq \phi_s \leq +\pi$.

As was the case with the basic embodiment of FIG. 1, when the phase-locked loop arrangement of FIG. 4 is operating at a frequency that is within $\pm 1/(2\tau)$ of a particular zero crossover $(4n-1)/(4\tau)$, where n is a positive real integer, phase shifter control network 36-1 integrates the signal supplied by phase detector 28 to supply a phase shift control signal, $V_p$, which causes variable phase shifter 32 to advance or retard signal phase by the amount necessary to align that zero crossover with the selected VCO output frequency. Thus, when the particular arrangement being described operates within the frequency range $(4n-3)/(4\tau)$ to $(4n+1)/(4\tau)$, phase shifter control signal $V_p$ and the implemented phase shift $\phi_s$ correspond to the linear functions of frequency that are respectively depicted in FIGS. 7b and 7c.

Figure 7A:
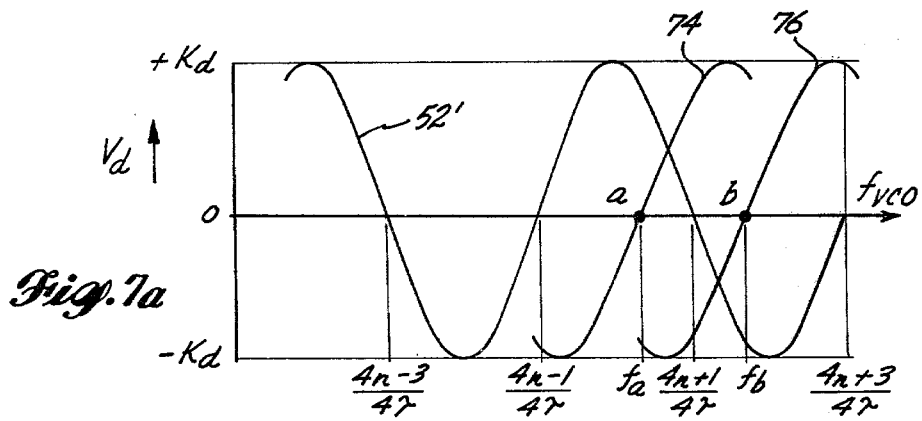
FIGS. 7a–7c depict electrical characteristics of the embodiment of FIG. 4 which are useful in understanding the manner in which the circuit is tuned over a relatively wide frequency range.
Figure 7B:
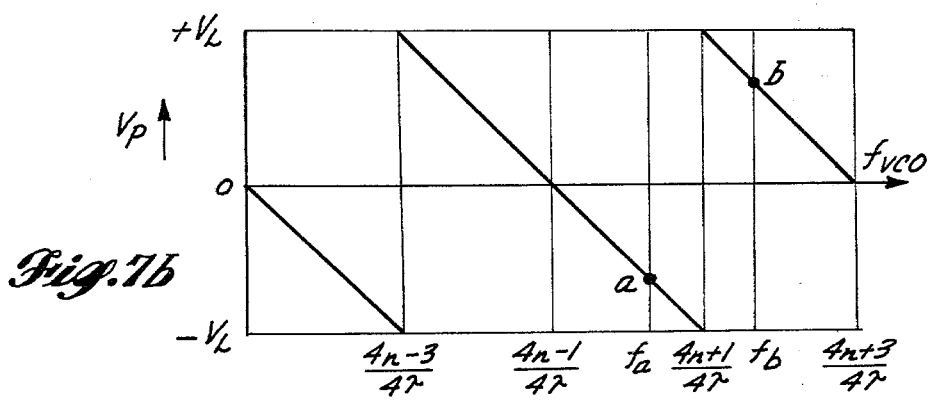
Figure 7C:
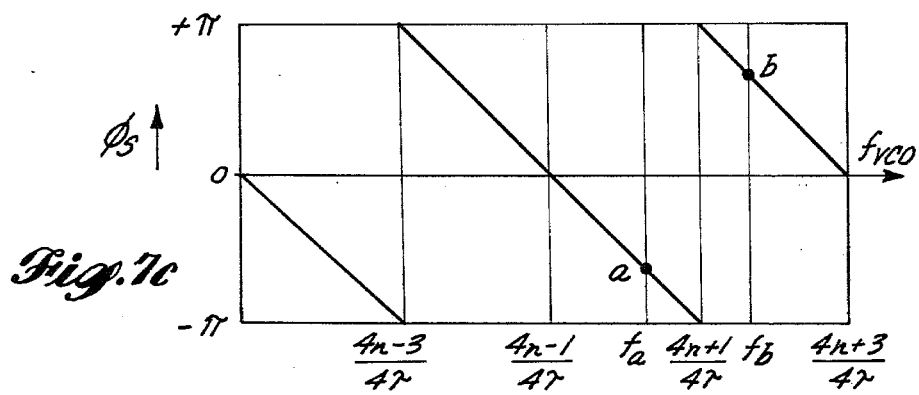

Examining FIG. 7 it can thus be recognized that selection of an output frequency which is greater than $(4n+1)/(4\tau)$ or is less than $(4n-3)/(4\tau)$ requires acquisition of a different zero crossover of zero-phase characteristic 52' and operation of variable phase shifter 32 so as to insert an appropriate new amount of phase shift. By way of example, assume that the embodiment of FIG. 4, is operating at an initial frequency $f_a$ having the associated values of $V_d$, $V_p$, and $\phi_s$ that are denoted as point "a" in FIGS. 7a, 7b, and 7c. Under the assumed conditions it should be noted that phase shifter 32 is supplying nearly $-\pi$ radians of phase shift (very close to the negative limit of the phase shifter range), and that the effective frequency discriminator characteristic is curve 74 of FIG. 7a. If VCO 12 is then programmed to switch to a new frequency $f_b$ by coupling an appropriate control signal to control input 62 of frequency divider 56, VCO 12 begins to immediately tune toward $f_b$ because of the action of the frequency selection path (phase-locked loop). Since the discriminator path continues to operate with the characteristic curve 74 of FIG. 7a, the signal $V_d$ is positive, which causes the phase shift control signal $V_p$ to become more negative. As $V_p$ reaches $-V_L$ (which corresponds to $-\pi$ radians of phase shift), comparator 64 is activated, which, in turn, causes switching unit 68 to activate switches 70 and 72 for a predetermined time interval. During this time interval capacitor 42 discharges through switch 70 so that the phase shift control signal $V_p$ becomes equal to zero and noise discriminator 16 thus exhibits the zero-phase characteristic 52'. The simultaneous opening of switch 72 prevents the signal supplied by phase detector 28 during the discharge of capacitor 42 from reaching summing unit 22 and interfering with phase-locked operation of VCO 12, and VCO 12 is rapidly locked to the new frequency $f_b$.

Since noise discriminator 16-1 is operating with the zero-phase characteristic 52' when the switches 70 and 72 are activated by switching unit 68, operation of VCO 12 at the newly selected frequency $f_b$ causes phase detector 28 to supply a negative voltage at its output terminal. As soon as switches 70 and 72 revert back to their normal condition, this negative signal voltage is integrated by phase shifter control 36-1 so that a positive phase shift control voltage $V_p$ results which causes phase shifter 32 to insert a positive phase shift, $\phi$. This positive phase shift causes the zero crossover at $(4n+3)/(4\pi)$ of zero-phase characteristic 52' to move downwardly in frequency by an amount equal to $\phi/(2\pi\tau)$. Since phase detector 28 supplies a negative output signal as variable phase shifter 32 supplies additional phase shift, phase shifter control circuit 36-1 will continue to increase the level of the phase shifter control signal $V_p$ until the zero crossover that corresponds to a frequency of $(4n+3)/(4\tau)$ in the zero-phase characteristic 52' exactly corresponds to the newly selected phase-locked loop frequency $f_b$. When this action is complete, variable phase shifter 32 supplies a phase shift slightly less than $+\pi$ radians and noise discriminator 16 exhibits the input-output relationship indicated by numeral 76 in FIG. 7a, with the circuit operating conditions being denoted by point "b" in FIGS. 7a, 7b, and 7c. When this new condition is attained, the discriminator loop continues to decrease phase noise in the previously described manner. Since phase shifter control 36-1 of the embodiment depicted in FIG. 4 operates in an analogous manner to align the next most antecedent crossover of the zero-phase characteristic 52' with the frequency of the signal supplied by VCO 12 whenever the phase-locked loop is reprogrammed to a frequency that lies more than $1/(2\tau)$ below a currently employed crossover of the zero-phase characteristic 52', it can be recognized that the embodiment of FIG. 4 is capable of providing operation over a frequency range commensurate with that of conventional phase-locked loop circuits.

Figure 8:
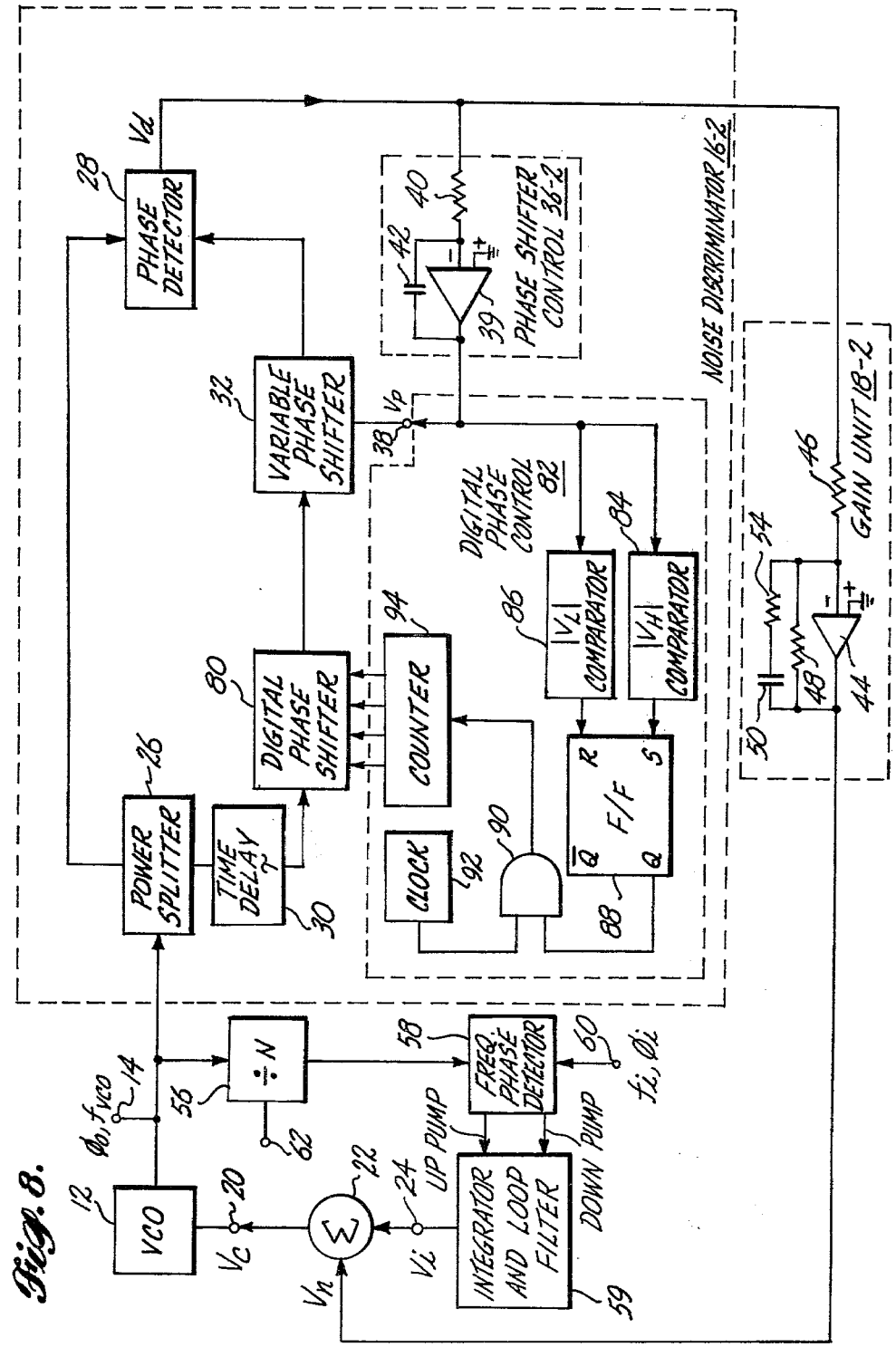
FIG. 8 depicts an alternative embodiment of the invention as a phase-locked loop system.

FIG. 8 depicts a further embodiment of the invention configured as a phase-locked loop arrangement which illustrates various previously mentioned variations of the present invention and depicts a second logic arrangement for automatically aligning a crossover of the discriminator zero-phase characteristic with each selected output frequency. Examining FIG. 8, it can be seen that this embodiment of the invention is identical to that depicted in FIG. 4 except for the topology of the noise discriminator 16-2. In particular, the noise discriminator 16-2 of FIG. 8 includes a digital phase shifter 80 and an associated digital phase control unit 82 with digital phase shifter 80 being connected in cascade with time delay unit 30 and variable phase shifter 32 to provide a portion of the phase shift required to align a crossover of the discriminator zero-phase characteristic with the desired system output frequency, $Nf_i$. This permits practice of the invention with a variable phase shifter 32 having a phase shift range of less than $-\pi$ to $+\pi$ radians. Such an embodiment of the invention is often advantageous in that, although analog phase shifters having a range extending between $-\pi$ and $+\pi$ radians are known in the art, conventional arrangements that operate over a narrower phase range are substantially less complex in structure. In fact, even though the block diagram of the embodiment depicted in FIG. 8 includes digital phase shifter 80 and digital phase control unit 82 for controlling digital phase shifter 80 and hence appears more complex than the arrangement of FIG. 4, a realization of the arrangement depicted in FIG. 8 may require fewer circuit components since digital phase shifter 80 and digital phase control unit 82 can be implemented with relatively few parts.

Noting that time delay 30, digital phase shifter 80, and variable phase shifter 32 all shift the phase of the signal coupled to the lower input port of phase detector 28, it can be seen that the signal supplied by phase detector 28 is $V_d = K_d \cos(\omega\tau + \phi_d + \phi_e)$, where $\phi_d$ and $\phi_e$ are the phase shifts provided by digital phase shifter 80 and variable phase shifter 32, and $K_d$ is the proportionality or gain constant of phase detector 28. Thus, considering operation of noise discriminator 16-2 in terms of its zero-phase characteristic (i.e., the relationship between $V_d$ and the frequency of the signal supplied by VCO 12 when $\phi_d + \phi_e = 0$), it can be seen that positive phase shift provided by variable phase shifter 32 and/or digital phase shifter 80, in effect, causes the zero-phase characteristic to shift downwardly in frequency by an amount equal to $(\phi_d + \phi_e)/(2\pi\tau)$. Accordingly, it can be seen that the phase shift range of variable phase shifter 32 and digital phase shifter 80 of the embodiment of FIG. 7 must provide a total phase shift capability of $2\pi$ radians in order to provide continuous operation over a frequency range that is greater than $1/\tau$.

Various conventional circuit arrangements can be used as variable phase shifter 32 and digital phase shifter 80 in the embodiment of the invention depicted in FIG. 8. For example, digital phase shifter 80 can be a type of digitally controlled phase shifter that provides phase shift over range of 0 to $+\phi_{dm}$ radians in steps of $\Delta\phi_d$ radians, where $\phi_{dm}$ denotes the maximum phase shift value and variable phase shifter 32 can be the previously mentioned conventional phase shifter which supplies a phase shift $$\phi_e = V_p \left( \frac{\phi_{em}}{V_H} \right)$$

over an input signal range of $-V_H \leq V_p \leq +V_H$ to thereby provide phase shift over the range $-\phi_{em}$ to $+\phi_{em}$. In such an arrangement, phase shifter control network 36-2 operates in the previously described manner to establish the phase shift inserted by variable phase shifter 32 and also supplies an input signal to the digital phase control 82 which causes digital phase shifter 80 to be activated whenever variable phase shifter 32 cannot supply the required amount of phase shift.

More specifically, in the arrangement of FIG. 8, the phase shift control signal $V_p$ that is supplied by phase shifter control network 36-2 is connected to the input terminal of a voltage comparator 84 denoted as $|V_H|$ and to the input of a second comparator 86 denoted as $|V_L|$. Comparator 84 is an absolute value comparator circuit arranged to supply a positive logic level whenever the magnitude (absolute value) of $V_p$ reaches $V_H$, i.e., whenever variable phase shifter 32 is stressed to its positive or negative phase shift limit. The positive going signal provided by $|V_H|$ comparator 84 is supplied to the set terminal (S) of a conventional set-reset flip-flop 88 having its Q output connected to one input terminal of an AND gate 90. Thus, whenever variable phase shifter 32 reaches its phase shift limit flip-flop 88 is set and AND gate 90 is enabled. With AND gate 90 thus enabled, pulses that are supplied to the second input terminal of AND gate 90 by a conventional oscillator or clock circuit 92 are coupled to the input of a digital counter circuit 94. Digital counter 94 is a conventional counting circuit that is interconnected to provide a parallel format, digitally encoded signal to the control terminals of digital phase shifter 80 wherein the signal supplied by counter 94 increments from zero to M in response to M successive pulses from the clock 92, resets to a count of zero upon application of the next clock pulse and is again incremented by subsequent clock pulses.

In view of the above described arrangement of the noise discriminator 16-2 of FIG. 8, it can be recognized that as long as phase shifter control network 36-2 and variable phase shifter 32 can maintain $V_d=0$ with $|V_p|<V_H$ (where $\pm V_H$ defines the linear range of the phase shifter), the arrangement of FIG. 8 operates in the manner described relative to the embodiment of FIG. 4. On the other hand, whenever frequency divider 56 of the phase-locked loop is programmed to tune VCO 12 to a frequency which results in $|V_p|>V_H$ (i.e., a frequency requiring more phase shift than can be provided by variable phase shifter 32), comparator 84 sets the flip-flop 88 which, in turn, causes the clock circuit 92 to increment the counter 94. Since each time counter 94 is incremented, digital phase shifter 80 adds a discrete amount of phase shift that is equal to $\phi_{dm}/M$, noise discriminator 16-2 in effect, moves the zero crossover of the noise detector output characteristic downward in frequency until phase shifter control network 36 supplies a signal $V_p$ so that $|V_p|<V_L$. When this occurs comparator 86 resets flip-flop 88 to disable the AND gate 90 and cause the counter 94 to remain at its present count. Thus, when the phase shift supplied by digital phase shifter 80 and variable phase shifter 32 reaches a value that causes phase shifter control network 36-2 to supply a signal such that $|V_p|<V_L$, the circuit of FIG. 8 enters an operating mode identical to that described relative to the embodiment of FIG. 4 wherein phase shifter control network 36 provides the additional phase shift necessary to exactly align a zero crossover of the noise discriminator zero-phase characteristic with the selected phase-locked loop frequency. Ensuring that the circuit arrangement can achieve the above-noted condition $|V_p|<V_L$ requires use of relatively small digital phase shift increments, $\phi_{dm}/M$ or a relatively large value of $V_L$. In this regard, it can be shown that reliable system operation is attained as long as $M>\phi_{dm}/(2\phi_{em})$.

In some situations it may be possible to eliminate digital phase control 82 of FIG. 8 and derive the appropriate digital control signal for digital phase shifter 80 from the VCO frequency control signal. For example, if the signal source of this invention is to be utilized in a system having digital computation capability, the VCO frequency control (e.g., the digital signal that establishes the divide-by-N factor) can be processed to determine the value of digital phase shift that should be provided by digital phase shifter 80 and the appropriate parallel format digital signal supplied by a memory unit or other conventional digital apparatus. One such arrangement is disclosed in detail in the previously referred to copending patent application of Kingsley W. Craft, which is assigned to the assignee of this invention and discloses a wideband frequency synthesis system that includes circuitry for precise phase or frequency modulation of the synthesized output signal.

Figure 9:
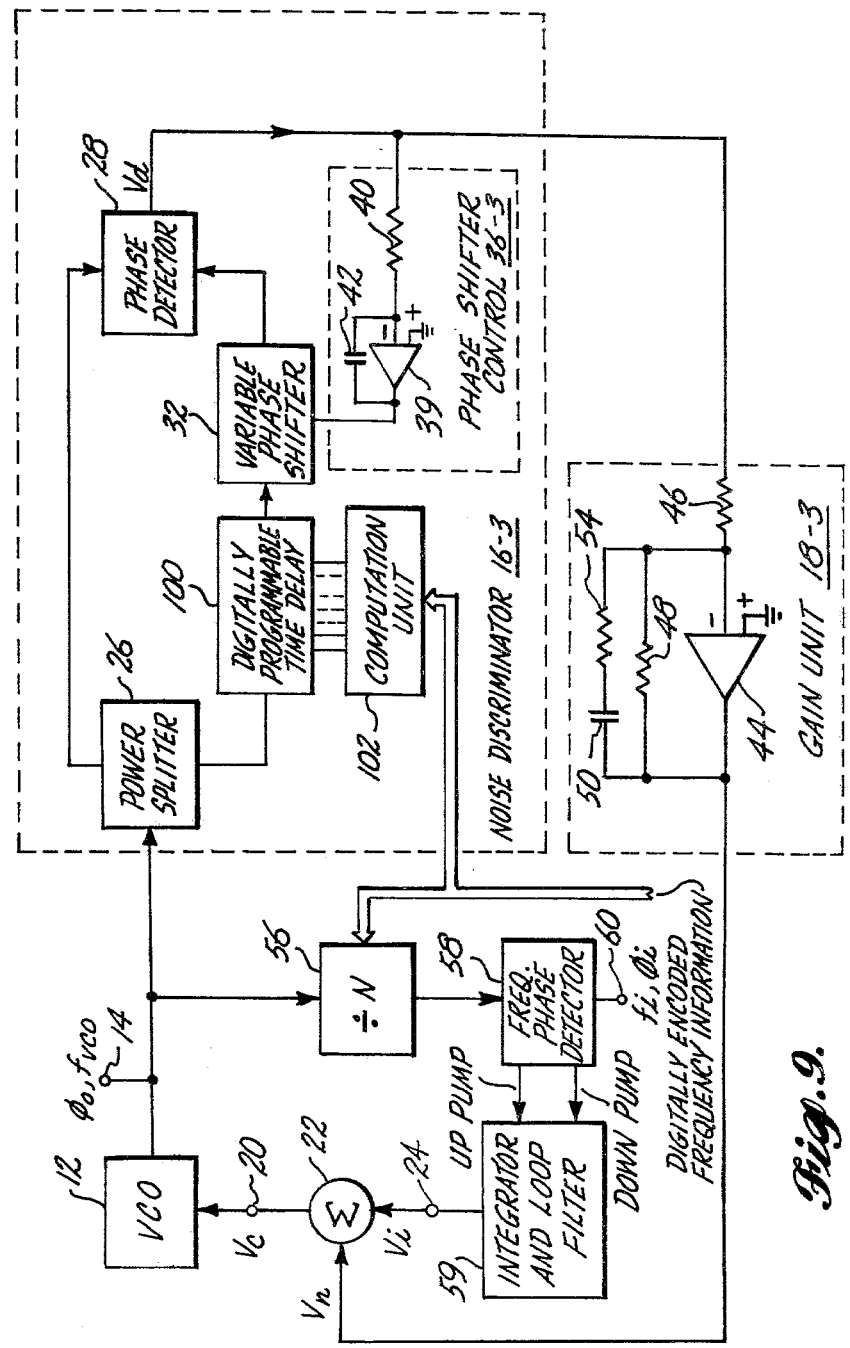
FIG. 9 is a block diagram of another embodiment of the invention as a phase-locked loop system wherein a computer or other computational unit controls the system operation; and, FIG. 10 depicts an integrator and loop filter suitable for use in the embodiments of FIGS. 4, 8 and 9.

Although each of the previously-described embodiments of the invention utilize a single predetermined time delay, $\tau$, those skilled in the art will recognize that the phase shift necessary to align a zero crossover of the noise discriminator zero-phase characteristic can be obtained by controlling the value of time delay as a function of the selected VCO frequency. For example, FIG. 9 depicts a phase-locked loop arrangement wherein the noise discriminator 16-3 employs a digitally-programmed time delay network 100 and a variable phase shifter 32 connected in cascade with one input port of the phase detector 28. In this arrangement, digitally programmable time delay 100 includes a plurality of time delays $\tau_1, \tau_2, \ldots, \tau_m$ with the amount of time delay exhibited being determined by a parallel format digital signal that is supplied to the time delay 100 by a computational unit 102. Such a digitally programmable time delay can be, for example, a series of separate SAW devices that are connected to form a tapped delay line with conventional transistor switches or gate circuitry being interconnected with the delay devices so as to selectively activate one or more delay device according to the digital signals supplied by computational unit 102.

Since computational unit 102, in effect, functions as a decoding network which transforms the frequency selection signal into a digitally encoded signal for activating digitally programmable time delay 100, it can be recognized that various circuit arrangements can be used. In this regard, the exact configuration of computational unit 102 generally depends on various system requirements such as the number of signal frequencies to be provided and the nature of the available frequency selection signal. For example, in utilizing a signal source of this invention within precision test equipment that may provide several hundred selectable signal frequencies in response to a digitally encoded frequency selection signal, it is often advantageous to employ a microprocessor arrangement as computational unit 102. As is known in the art, conventional microprocessor arrangements comprise a relatively small number of integrated circuits which include random access and read only memory devices, input/output circuitry and a central processing unit having an arithmetic unit. In implementing the embodiment of FIG. 9 with such a microprocessor, operating instructions and nonvolatile data necessary for causing the arithmetic unit to calculate a value of time delay which will cause a zero crossover of the noise discriminator to occur at a frequency identically equal to the selected system frequency can be stored within the read only memory. As each signal frequency is selected, digitally encoded frequency information is supplied to the microprocessor and the arithmetic unit supplies a signal to the digitally programmable time delay 100 for selecting the available time delay that is nearest to the calculated value. The variable phase shifter 32 then operates in the previously-described manner to exactly align the discriminator zero crossing with the selected frequency so that phase detector 28 exhibits an output of zero volts at each programmed or selected frequency.

Regardless of the exact configuration of computational unit 102, it can thus be recognized that the selectable time delays provided by digitally programmable time delay unit 100 are preferably based on the frequencies to be provided by a particular realization of the embodiment depicted in FIG. 9. In this regard, to provide continuous frequency coverage the phase shift range exhibited by variable phase shifter 32 must be established so that one of the available discriminator zero crossings can be aligned with each desired signal frequency.

Those skilled in the art will recognize that the embodiments discussed herein are exemplary in nature and that various modifications and variations can be made therein without departing from the scope and spirit of the invention. For example, as previously mentioned, variously configured time delays and variable phase shifters can be utilized in either of the circuit paths that couple the VCO signal to the two input ports of the noise discriminator phase detector. Further, although embodiment of the invention as a phase-locked loop has been described relative to a simple conventional divide-by-N system, various phase-locked configurations can be utilized. Such phase-locked loops include, for example, high resolution systems such as that disclosed in the copending patent application Ser. No. 168,066 of Floyd D. Erps, entitled "Phase-Locked Loop Frequency Synthesizer", that is assigned to the assignee of this invention and was filed the same date as this application.

The embodiments of the invention in which an exclusive property or privilege is claimed are defined as follows:

1. A low phase noise signal source comprising:
controlled oscillator means having an output terminal and a frequency control terminal, said controlled oscillator means for generating a periodic signal at a frequency determined by a frequency control signal supplied to said frequency control terminal;
a first feedback path including noise discriminator means connected for supplying a feedback signal from said output terminal of said controlled oscillator means to said frequency control terminal thereof, said noise discriminator means including phase detector means having first and second input ports and an output port, said first and second input ports of said phase detector means being connected for receiving at least a portion of the signal supplied at said output terminal of said voltage-controlled oscillator means, said phase detector means including means for supplying a signal at said output port thereof that is representative of the phase difference between signals supplied to said first and second input ports; said noise discriminator means including time delay means for delaying an applied signal by a predetermined amount of time $\tau$, said time delay means connected to delay the signal coupled to one of said first and second input ports of said phase detector means from said output terminal of said controlled oscillator means; said noise discriminator means including variable phase shift means having a phase shift control terminal and including means for shifting the phase of an applied signal by an amount determined by a phase shift control signal applied to said phase shift control terminal, said variable phase shift means being connected to shift the phase of the signal being coupled to one of said first and second input ports of said phase detector means from said output terminal of said controlled oscillator means; said noise discriminator means further including phase shift control means for supplying said phase shift control signal to said variable phase shift means, said phase shift control means being responsive to the signal supplied at said output port of said phase detector means and supplying a signal representative thereof to cause said variable phase shift means to supply a phase shift that minimizes the signal at said output port of said phase detector means; and
signal coupling means for coupling said signal supplied at said output port of said phase detector means as said noise discriminator feedback signal that is coupled to said frequency control terminal of said controlled oscillator means, said signal coupling means including means for establishing said feedback signal as negative feedback.

2. The low phase noise signal source of claim 1 wherein said controlled oscillator means, said noise discriminator means and said signal coupling means are configured and arranged to establish two dominant zeroes and two dominant poles in the transfer function describing the ratio of the signal phase supplied to said output terminal of said controlled oscillator means to the magnitude of the frequency control signal supplied to said frequency control terminal of said controlled oscillator means, said poles being associated with the frequencies $\omega_0 G_0$ and $\omega_2/G_0$, where $\omega_0$ and $\omega_2$ define said zeroes of said transfer function, $\omega_0$ and $\omega_2$ being determined by circuit components within said noise discriminator and said coupling means and $G_0$ being a gain factor determined at least in part by said time delay $\tau$ and gain factors associated with said controlled oscillator means, said noise discriminator phase detector means and said signal coupling means, the parameter values controlling $\omega_0$, $G_0$ and $\omega_2$ being selected to establish $\omega_0$ greater than $\omega_2$ and $G_0$ greater than unity.

3. The low phase noise signal source of claim 2 wherein said pole $\omega_0 G_0$ at least nearly corresponds to a frequency of $\pi/\tau$, at least one of said noise discriminator means and said coupling means are further configured and arranged to establish an additional zero in said transfer function which substantially corresponds to a frequency at least nearly equal to $\pi/\tau$.

4. The low phase noise signal source of claim 3 wherein said phase shift control means comprises a signal integrator having an output terminal connected to said phase shift control terminal of said variable phase shift means and an input terminal connected for receiving the signal supplied at the output port of said phase detector means and wherein said coupling means comprises an amplifier stage having an input terminal connected for receiving the signal supplied to said output port of said phase detector means and an output terminal coupled to said frequency control terminal of said controlled oscillator means.

5. The low phase noise signal source of claim 4 wherein said signal integrator includes a first resistor, a first capacitor, and a first operational amplifier having an inverting input terminal and an output terminal, said first resistor being connected between said inverting input terminal of said first operational amplifier and said output port of said phase detector, said first capacitor being connected between said inverting input terminal and said output terminal of said first operational amplifier, said output terminal of said first operational amplifier being connected to said phase shift control terminal of said variable phase shift means, said first resistor and said first capacitor establishing the value of said zero $\omega_2$ of said transfer function; and wherein said amplifier stage includes a second capacitor, second and third resistors, and a second operational amplifier having an inverting input terminal and an output terminal, said second resistor connected between said output port of said phase detector means and said inverting input terminal of said second operational amplifier, said third resistor and said second capacitor being connected in parallel with one another between said inverting input terminal and said output terminal of said second operational amplifier, said output terminal of said second operational amplifier being coupled to said frequency control terminal of said controlled oscillator means, said second capacitor and said third resistor establishing the value of said zero $\omega_0$ of said transfer function.

6. The low phase noise signal source of claim 5 wherein said amplifier stage includes a fourth resistor connected in series with said second capacitor with said third resistor being in parallel with said series-connected fourth resistor and second capacitor, the product of the resistance value of said fourth resistor and the capacitance value of said second capacitor being established approximately equal to $\tau/\pi$ to establish said additional zero in said transfer function at a frequency $\omega$ substantially equal to $\pi/\tau$.

7. The low phase noise signal source of claim 6 wherein said controlled oscillator means exhibits a transfer characteristic of approximately $K_v/s$, where $K_v$ is a gain factor and s is the Laplacian operator; and wherein said phase detector means supplies an output signal at least approximately equal to $K_d \cos\phi$, where $K_d$ is a gain factor and $\phi$ is a phase difference between the signals coupled to said first and second input ports of said phase detector means; said gain factors of said controlled oscillator means and said phase detector means establishing said gain $G_0$ substantially equal to $K_v K_d \tau A_0$, where $A_0$ is substantially equal to the value of said third resistor divided by the value of said second resistor, said values of said gain factors of said controlled oscillator means and said phase detector means further establishing the value of said zero $\omega_2$ of said transfer function substantially equal to $K_v K_d/(R1C1)$ where R1 and C1 represent the resistance and capacitance values of said first resistor and said first capacitor.

8. The low phase noise signal source of claim 7 wherein said variable phase shifter exhibits a phase shift range extending between $-\pi$ radians and $+\pi$ radians.

9. The low phase noise signal source of claims 1, 2, 3, 4, 5, 6, 7 or 8 further comprising a second feedback path for phase-locking said low phase noise signal source to an applied reference signal, said second feedback path including a second phase detector means having an output port and first and second input ports, said first input port of said second phase detector means being coupled to said output terminal of said controlled oscillator means for receiving a signal at a frequency dependent on the frequency of said controlled oscillator means, said second input port of said second phase detector means being connected for receiving a signal at a reference frequency and phase, said output port of said second phase detector means being connected for coupling a signal to said frequency control terminal of said controlled oscillator means to lock said controlled oscillator means at a frequency determined at least in part by said reference frequency.

10. The low phase noise signal source of claim 9 wherein said second feedback path includes a programmable frequency divider for dividing the frequency of a signal applied thereto by a selectable frequency division ratio N, said programmable frequency divider having an input terminal coupled to the output terminal of said controlled oscillator means, said programmable frequency divider being responsive to an applied programming signal for establishing said value of N, said programmable frequency divider having an output terminal coupled to said first input port of said second phase detector so that said controlled oscillator means and said second feedback path are arranged as a programmable divide-by-N phase-lock loop that is modified by said first feedback path.

11. The low phase noise signal source of claim 10 wherein the phase-locked system consisting of said controlled oscillator means and said first and second feedback paths exhibits a bandwidth substantially equal to $\omega_3/G_0$, where $\omega_3$ is equal to $K_v K_\phi/N$, with $K_\phi$ representing the gain factor of said second phase detector means; said bandwidth being established so as to exhibit a value greater than the value of $\omega_2$.

12. The low phase noise signal source of claim 11 wherein said first feedback path further includes logic means responsive to the magnitude of said phase shift control signal, said logic means including switch means for interrupting the signal supplied to said frequency control terminal of said controlled oscillator means by said first feedback path when the magnitude of said phase shift control signal reaches a predetermined level, said switching means further including means for reducing the magnitude of said phase shift control signal to substantially zero simultaneously with the interruption of said signal to said controlled oscillator means.

13. The low phase noise signal source of claim 11 wherein said noise discriminator means of said first feedback path includes digitally controlled phase shift means responsive to an applied digitally-encoded signal for supplying an amount of phase shift that is determined by the decimal equivalent value of said applied digitally-encoded signal, said digitally-controlled phase shift means being connected for shifting the phase of the signal coupled to one of said first and second input ports of said first phase detector means, said noise discriminator means further including logic means coupled to said phase shift control terminal of said variable phase shifter, said logic means including means for supplying a first logic signal when the magnitude of said phase shift control signal at said phase shift control terminal of said variable phase shifter is outside a predetermined range, said logic means including means for supplying a second logic signal when said phase shift control signal at said phase shift control terminal of said variable phase shifter is outside a predetermined range, said logic means further including switching means responsive to said first logic signal and said second logic signal, said switching means being connected for supplying said digitally-encoded signal to said digital phase shift means, said switching means including means for incrementing said digitally-encoded signals supplied to said digital phase shift means between predetermined upper and lower decimal equivalent values when said first logic signal is supplied by said logic means, said switching means further including means for maintaining a present digitally-encoded signal when said second logic signal is supplied by said logic means.

* * * * *